(12) United States Patent
Satoh et al.

(10) Patent No.: US 10,474,770 B2
(45) Date of Patent: Nov. 12, 2019

(54) SIMULATION DEVICE, SIMULATION METHOD, AND MEMORY MEDIUM

(71) Applicant: NEC CORPORATION, Tokyo (JP)

(72) Inventors: Mineto Satoh, Tokyo (JP); Soichiro Araki, Tokyo (JP)

(73) Assignee: NEC CORPORATION, Minato-ku, Tokyo (JP)

(*) Notice: Subject to any disclaimer, the term of this patent is extended or adjusted under 35 U.S.C. 154(b) by 262 days.

(21) Appl. No.: 15/506,505

(22) PCT Filed: Aug. 18, 2015

(86) PCT No.: PCT/JP2015/004081
§ 371 (c)(1),
(2) Date: Feb. 24, 2017

(87) PCT Pub. No.: WO2016/031174
PCT Pub. Date: Mar. 3, 2016

(65) Prior Publication Data
US 2017/0255720 A1 Sep. 7, 2017

(30) Foreign Application Priority Data
Aug. 27, 2014 (JP) .................................. 2014-172371

(51) Int. Cl.
*G06F 17/50* (2006.01)
*G01W 1/10* (2006.01)
(Continued)

(52) U.S. Cl.
CPC .......... *G06F 17/5009* (2013.01); *G01W 1/10* (2013.01); *G06F 17/16* (2013.01); *G06F 17/175* (2013.01); *G06F 17/18* (2013.01)

(58) Field of Classification Search
USPC ............................. 703/2, 5; 706/47; 704/240
See application file for complete search history.

(56) References Cited

U.S. PATENT DOCUMENTS 6,480,814 B1 * 11/2002 Levitan .................. G06N 3/126
 703/2
7,454,336 B2 * 11/2008 Attias .................. G06K 9/6226
 704/240
(Continued)

FOREIGN PATENT DOCUMENTS

CN 101794115 A 8/2010
CN 101950315 A 1/2011
(Continued)

OTHER PUBLICATIONS

International Search Report for PCT/JP2015/004081 dated Nov. 24, 2015 [PCT/ISA/210].
(Continued)

*Primary Examiner* — Thai Q Phan
(74) *Attorney, Agent, or Firm* — Sughrue Mion, PLLC

(57) ABSTRACT

A simulation device includes a system model, a data selection processing unit, a plurality of observation models, a post-distribution creating unit, a post-distribution unifying unit, and a determining unit. The system model calculates a time evolution of a state vector. The data selection processing unit selects multiple items of observation data. The observation model converts the state vector from the system model on the basis of the relationship with the observation data. The post-distribution creating unit creates, on the basis of the state vector from the observation model and the selected observation data, a first post-distribution based on all pieces of the observation data or a second post-distribution based on absent observation data. The post-distribution unifying unit unifies the first and second post-distributions. The determining unit determines which of the second post-distribution or the unified post-distribution is to be used.

13 Claims, 15 Drawing Sheets

(51) Int. Cl.
*G06F 17/16* (2006.01)
*G06F 17/17* (2006.01)
*G06F 17/18* (2006.01)

(56) References Cited

U.S. PATENT DOCUMENTS

| | | | | |
|---|---|---|---|---|
| 7,480,615 B2* | 1/2009 | Attias | ............ | G10L 15/14 |
| | | | | 700/29 |
| 2005/0159951 A1* | 7/2005 | Attias | ............ | G10L 15/14 |
| | | | | 704/240 |
| 2010/0274102 A1* | 10/2010 | Teixeira | ......... | A61B 5/14552 |
| | | | | 600/301 |
| 2013/0046721 A1* | 2/2013 | Jiang | ............ | G01W 1/10 |
| | | | | 706/47 |

FOREIGN PATENT DOCUMENTS

| | | |
|---|---|---|
| JP | 2003-90888 A | 3/2003 |
| JP | 2007-93461 A | 4/2007 |
| JP | 2010-60443 A | 3/2010 |
| JP | 2010-60444 A | 3/2010 |
| JP | 2013-84072 A | 5/2013 |
| WO | 2011/102520 A1 | 8/2011 |

OTHER PUBLICATIONS

Written Opinion for PCT/JP2015/004081 dated Nov. 24, 2015 [PCT/ISA/210].
Liang Xue et al: "A multimodel data assimilation framework via the ensemble Kalman filter", Water Resources Research; AGU Publications; May 2014, pp. 4197-4219.
Dan Lu et al: "Multimodel Bayesian analysis of data-worth applied to unsaturated fractured tuffs" Advances in Water Resources; vol. 35 (2012); p. 69-82.
Shlomo P Neuman et al: "Bayesian analysis of data-worth considering model and parameter uncertainties", Advances in Water Resources, vol. 36, Feb. 2012. pp. 75-85.
Communication dated Apr. 25, 2018, from European Patent office in counterpart application No. 15835871.3.
Communication dated Mar. 14, 2019 from the State Intellectual Property Office of the P.R.C. in counterpart Application No. 201580045955.1.

* cited by examiner

SIMULATION DEVICE, SIMULATION METHOD, AND MEMORY MEDIUM

CROSS REFERENCE TO RELATED APPLICATIONS

This application is a National Stage of International Application No. PCT/JP2015/004081, filed on Aug. 18, 2015, which claims priority from Japanese Patent Application No. 2014-172371, filed on Aug. 27, 2014, the contents of all of which are incorporated herein by reference in their entirety.

TECHNICAL FIELD

The present invention relates to a simulation technology of mathematically modeling and numerically calculating in a computer a phenomenon taking place in the real world and a hypothetical situation.

BACKGROUND ART

Simulation mathematically models and numerically calculates in a computer a phenomenon taking place in the real world and a hypothetical situation. Mathematical modelling enables calculation to be performed with time and space set as desired. Such simulation enables a situation in which obtaining actual results is difficult (for example, a situation at a place where performing observation is difficult) and an event that may occur in the future to be predicted. Varying conditions for calculation intentionally enables features and behavior in a situation that is difficult to actually observe to be studied. Such a simulation result may be put to use as an indicator in theoretical clarification of a cause-and-effect relationship, designing, planning, or the like.

In particular, simulation is effective in the case in which it is desired to grasp and understand a state continuously over a wide range in a situation in which observation data actually obtained have a small number of data pieces and a distribution biased not only spatially but also temporally. However, simulation is only imitating a reality mathematically, and accuracy thereof thus depends on how deeply the reality is understood and how faithfully imitated. Therefore, in the case of targeting a phenomenon whose actual observation data is small in quantity as described above and which is incompletely understood, a model comes to include incompleteness. Moreover, since calculation is performed discretely, fractionation of a target domain and a large amount of calculation are required to grasp it continuously over a wide range. In practice, however, there is no other choice but to set a calculation condition including incompleteness in accordance with allowable computation time and computational resources. Such incompleteness reduces the accuracy of simulation.

Thus, as a scheme for improving the accuracy of simulation under the condition having such incompleteness, data assimilation is known. Data assimilation is a method of incorporating observation data obtained from reality into a numerical simulation. Even performing simulation based on the same mathematical model yields various results depending on the afore-described internal incompleteness, a given initial condition, a boundary condition, and the like. Data assimilation searches out a result explaining observation data obtained in reality best from the various simulation results and, at the same time, updates the model and conditions.

Data assimilation, which is often used in earth science and oceanography, not only has been developed especially in meteorology and has been contributing to improvements in accuracy of daily weather forecasts, but also new methods thereof have been proposed successively. That is partly because improvements in observation technologies relating to weather have caused obtainable observation data to become diverse and the quantity of data has increased not only spatially but also temporally.

In weather forecasting, improving spatial and temporal accuracy of simulation to predict a rapidly developing thundercloud and rain accurately is also a problem. As a related technology for coping with such a problem, a weather prediction device disclosed in PTL 1 is known. The weather prediction device uses precipitable water data collected by GPS receivers, which are placed at a lot of locations and which enable frequent observation, wind direction and wind speed data collected by Doppler radars, and rainfall intensity data collected by Radar-AMeDAS. The weather prediction device takes in the above-described data measured in real time or quasi-real time and performs data assimilation using the three-dimensional variational method. As another related technology for coping with the problem described above, a synchronization device and a meshing device disclosed in PTL 2 is known. When data pieces from a plurality of observation devices are asynchronous, the synchronization device reorganizes the observation data pieces on the time axis by means of interpolation processing to synchronize the observation data pieces so that the observation data pieces indicate observation data pieces of the same time. The meshing device rearranges, in a target domain, synchronized observation data pieces collected at a plurality of places so that the observation data pieces are positioned at mesh points (grid points) with a fixed distance interval in a horizontal space.

After a natural disaster, an artificial accident, and the like caused by a sudden change in weather or a marine environment, grasping a state of the soil accurately over a wide range is required. To achieve the requirement, observing and estimating a state of the soil by use of a wide-ranging observation means and with high accuracy becomes a problem. As a related technology for coping with such a problem, a method disclosed in PTL 3 is known. Although not being a method utilizing simulation, the method, using satellite images collected at three or more times, estimates feature quantities representing corresponding states of the soil. For more details, when there is not enough time and cost for conducting observation and investigation in the field or it is dangerous to approach the field, the method uses image data collected by a synthetic aperture radar (SAR) or the like mounted on an artificial satellite. The method, using the satellite SAR images, enables a state of the soil to be grasped speedily, over a wide range, and safely. As a specific example, an example in which soil salinity and drainability in a coastal area after a tsunami occurrence are estimated on the basis of changes in index values of soil moisture content recorded in satellite images collected at three times: before the tsunami occurrence; immediately thereafter; and several months later is described in PTL 3.

An example of a method of, by use of satellite SAR images and a yield prediction model of a crop, performing yield prediction of paddy rice fields in wide-ranging areas in the first half of a growing period with little labor and with high accuracy is described in PTL 4. In general, an optical sensor mounted on a satellite that observes the intensity of reflected light from sunlight in the visible and near-infrared regions is substantially influenced from weather, as in the case in which, when there is a cloud, observation is not able to be performed. Thus, in the method, SAR image data collected using a microwave (X-band: wavelength of 3.1 cm), which is not influenced by a cloud, are used. In the method, a yield prediction expression, using regression analysis, based on a correlation between obtained SAR image data and a quantity representing the growth state of a crop, such as plant height and the number of stems, is calculated to perform a yield prediction.

Although being different from simulation of the real world, there is a case in which a mathematical model is used for analysis of observation data. For example, in a use of determining whether or not an object exists in a predetermined area using millimeter wave radar or the like, accurate determination based on only observation data was difficult. That is because, in particular, when an object is a walker, reflection intensity of radar is substantially small (an SN ratio, that is, a signal to noise ratio, is small) and, due to various postural change of the walker, reflection intensity changes moment by moment. As a related technology for coping with such a problem, a method disclosed in PTL 5 is known. In the method, from a distribution of reflection intensity with respect to detection positions of an object, feature quantity models of a walker signal and a noise signal are created in advance. By comparing actual observation data with the models, in the method, states including "existent", "non-existent", and "unclear" are probabilistically estimated based on non-ideal observation data. In addition, in PTL 5, a method for, with respect to the states of "existence", "non-existence", and "unclear", unifying probabilities of a plurality of states obtained from a plurality of sensors is also described.

CITATION LIST

Patent Literature

[PTL 1] Japanese Unexamined Patent Application Publication No. 2010-60443
[PTL 2] Japanese Unexamined Patent Application Publication No. 2010-60444
[PTL 3] Japanese Unexamined Patent Application Publication No. 2013-84072
[PTL 4] PCT International Patent Application No. WO2011/102520
[PTL 5] Japanese Unexamined Patent Application Publication No. 2007-93461

SUMMARY OF INVENTION

Technical Problem

In each of the above-described related technologies, increasing the types and number of pieces of observation data to be obtained is the starting point of means solving the problems of improving accuracy of simulation having incompleteness and estimating a state based on non-ideal observation data. However, since observation data to be increased are not always ideal, a processing method taking into consideration non-ideal observation data is indispensable. For example, in PTL 1, an abnormal value removal device that removes abnormal values after having obtained observation data is described. The abnormal value removal device determines, to be abnormal values, observation data that have a difference not smaller than a predetermined value from calculated values based on a weather model at an identical time. However, in such abnormal value determination based on a single piece of information that is local and a model-based calculated value, rapidly changing states and environments or phenomena having peculiarities is not able to be taken into consideration. The related technology disclosed in PTL 5 is capable of estimating various states including a possibility of a peculiarity and the like on the basis of a greater variety of information because of performing probabilistic unification after comparing observation data with models. However, the related technology mainly uses a general weighted average as a unification method of probabilities and has a problem in that only observation data of the same type and with the same number of dimensions are subject to unification. The related technique also has a problem in that no scheme enabling determination or revision of unification results is taken into consideration.

As a measure to raise the accuracy of simulation having incompleteness and perform state estimation based on non-ideal observation data, processing obtained observation data in advance is conceivable in addition to increasing the types and the number of pieces of observation data to be collected. Although the synchronization device and meshing device disclosed in PTL 2 perform temporal and spatial interpolation statistically based on only obtained observation data, obtaining observation data that are continuous and that have a high correlation is a prerequisite. PTL 3 includes a description of a method of estimating a state of soil by unifying satellite images collected at three different times. However, PTL 3 does not refer to any measure against a case in which satellite data have not been obtained at an optimal time and a case in which data exhibit a peculiar value influenced from water remaining on a soil surface and the like. As described above, the related technologies disclosed in PTLs 2 and 3 do not take into consideration observation data having any discontinuity and peculiarity. The related technology disclosed in PTL 4 uses microwave sensor data with priority given to the certainty of data obtainment instead of optical sensor data characterized by unstableness of the time interval for collection of ideal observation data due to influence from weather. Since the related technology creates a yield prediction model recursively (inductively) based on data obtained in such a way, there is a concern that the related technology may create an inappropriate model in the case in which the data have a discontinuity or peculiarity.

Next, a problem in simulation using typical data assimilation, disclosed in PTLs 1 and 2, will be described with reference to the drawing. In FIG. 15, a schematic diagram illustrating simulation using typical data assimilation is presented. In FIG. 15, the horizontal axis and the vertical axis represent the time and observation values, respectively. The observation values are values actually measured by sensors and the like. A state variable is a variable to calculate the time evolutions thereof in a simulation model. Observation values are not always true values of a target quantity because of influence from observation frequency, sensor accuracy, and the like. Thus, in FIG. 15, the unknown true values are virtually illustrated by a broken line. Since observation values are related with a state variable by an observation model, calculating a time variation of the state variable enables simulation of observation values to be performed. As described afore, however, in the case in which there is incompleteness residing in the model or an uncertainty in a boundary condition, or depending on a given initial condition, it is difficult for simulation to reproduce true values. Thus, in data assimilation, a disturbance is intentionally added to perform stochastic simulation and, from obtained various simulation results, a result explaining observation data obtained from reality best is searched out.

In FIG. 15, this process is schematically illustrated by solid lines expressing a plurality of calculated values (simulations). Each simulation is continued using, as an initial value of the next step, a value that is revised on the basis of an observation value. As is obvious from FIG. 15, if time until obtaining a next observation value is long, simulation values during the period cannot be revised, which causes errors from the true values to be added up and grow larger. In the case in which obtained observation values are inappropriate or includes a lot of errors, since a value revised on the basis of the data is to be used as an initial value of the next step, simulation values during a period until a next reliable value is obtained come to have large errors.

The present invention is made in consideration of the above-described problems. That is, an object of the present invention is to provide a technology of performing a high-resolution and high-accuracy simulation over a wide range taking into consideration non-ideal observation data and observation data that have a discontinuity or peculiarity.

Solution to Problem

In order to achieve the object described above, a simulation device of the present invention includes: input means for obtaining an initial state of a state vector and a parameter in a simulation and a plurality of pieces of observation data as input; a system model that, based on the initial state and the parameter, simulates a time evolution of the state vector; data selection processing means for, based on information relating to the state vector in the system model, selecting, from the plurality of pieces of observation data, a plurality of pieces of observation data to be used; plurality of observation models, each being associated with one of the selected plurality of pieces of observation data, each of which transforms and outputs a state vector output from the system model based on a relationship between the observation data and the state vector; posterior distribution creating means for, based on state vectors output from the plurality of observation models and pieces of observation data selected by the data selection processing means, creating posterior distributions of the state vector, outputting a posterior distribution based on all pieces of observation data selected by the data selection processing means as a first posterior distribution, and outputting a posterior distribution based on a set of observation data lacking one or more pieces of observation data as a second posterior distribution; posterior distribution unifying means for performing unification of the first posterior distribution and the second posterior distribution; determining means for determining which one of the second posterior distribution and a posterior distribution after the unification is to be used; and output means for, in addition to inputting a state vector including a posterior distribution determined by the determining means and the first posterior distribution to the system model, outputting a time series of the state vector.

A simulation method of the present invention includes: when an initial state of a state vector and a parameter in a simulation and a plurality of pieces of observation data are input, simulating a time evolution of the state vector using a system model based on the initial state and the parameter; selecting, from the plurality of pieces of observation data, a plurality of pieces of observation data to be used based on information related to the state vector in the system model; transforming, by use of a plurality of observation models each of which is associated with one of the selected plurality of pieces of observation data, the state vector output from the system model based on a relationship between the piece of observation data and the state vector; creating posterior distributions of the state vector based on state vectors output from the plurality of observation models and the selected pieces of observation data; performing unification of a first posterior distribution based on all the selected pieces of observation data and a second posterior distribution based on a set of observation data lacking one or more pieces of observation data; determining which one of the second posterior distribution and a posterior distribution after the unification is to be used; inputting a state vector including a determined posterior distribution and the first posterior distribution to the system model; and outputting a time series of a state vector including a determined posterior distribution and the first posterior distribution.

A storage medium of the present invention stores a computer program, the program making a computer device execute: an input step of obtaining an initial state of a state vector and a parameter in a simulation and a plurality of pieces of observation data as input; a system model calculation step of, based on the initial state and the parameter, simulating a time evolution of the state vector using a system model; a data selection processing step of, based on information relating to the state vector in the system model, selecting, from the plurality of pieces of observation data, a plurality of pieces of observation data to be used; an observation model calculation step of, by use of a plurality of observation models each of which is associated with one of the selected plurality of pieces of observation data, transforming and outputting each state vector output from the system model based on a relationship between the piece of observation data and the state vector; a posterior distribution creating step of, based on state vectors output from the plurality of observation models and pieces of observation data selected in the data selection processing step, creating posterior distributions of the state vector, outputting a posterior distribution based on all pieces of observation data selected in the data selection processing step as a first posterior distribution, and outputting a posterior distribution based on a set of observation data lacking one or more pieces of observation data as a second posterior distribution; a posterior distribution unifying step of performing unification of the first posterior distribution and the second posterior distribution; a determining step of determining which one of the second posterior distribution and a posterior distribution after the unification is to be used; and an output step of inputting a state vector including a posterior distribution determined in the determining step and the first posterior distribution to the system model and outputting a time series of the state vector.

Advantageous Effects of Invention

The present invention provides a technology of performing a high-resolution and high-accuracy simulation over a wide range taking into consideration non-ideal observation data and observation data that have a discontinuity or peculiarity.

DESCRIPTION OF EMBODIMENTS

Hereinafter, example embodiments of the present invention will be described with reference to drawings.

(First Example Embodiment)

A simulation device 100 as a first example embodiment of the present invention will be described. The simulation device 100 is applicable to simulation that solves a continuous time-space partial differential equation formulated according to physical laws and follows a time evolution. Such partial differential equations include, for example, an equation of motion that describes motion, Navier-Stokes equations that describe fluid, a thermodynamic equation that describes thermal change, and a shallow-water wave equation that describes tsunamis. The simulation device 100 is also applicable to simulation using a finite element method. In the present example embodiment, it is assumed that a system subject to simulation is a system in which a state vector the temporal change of which is followed is linked with actual observation data by means of any relational expression, that is, a system that allows comparison between simulation results and observation data.

Figure 1:
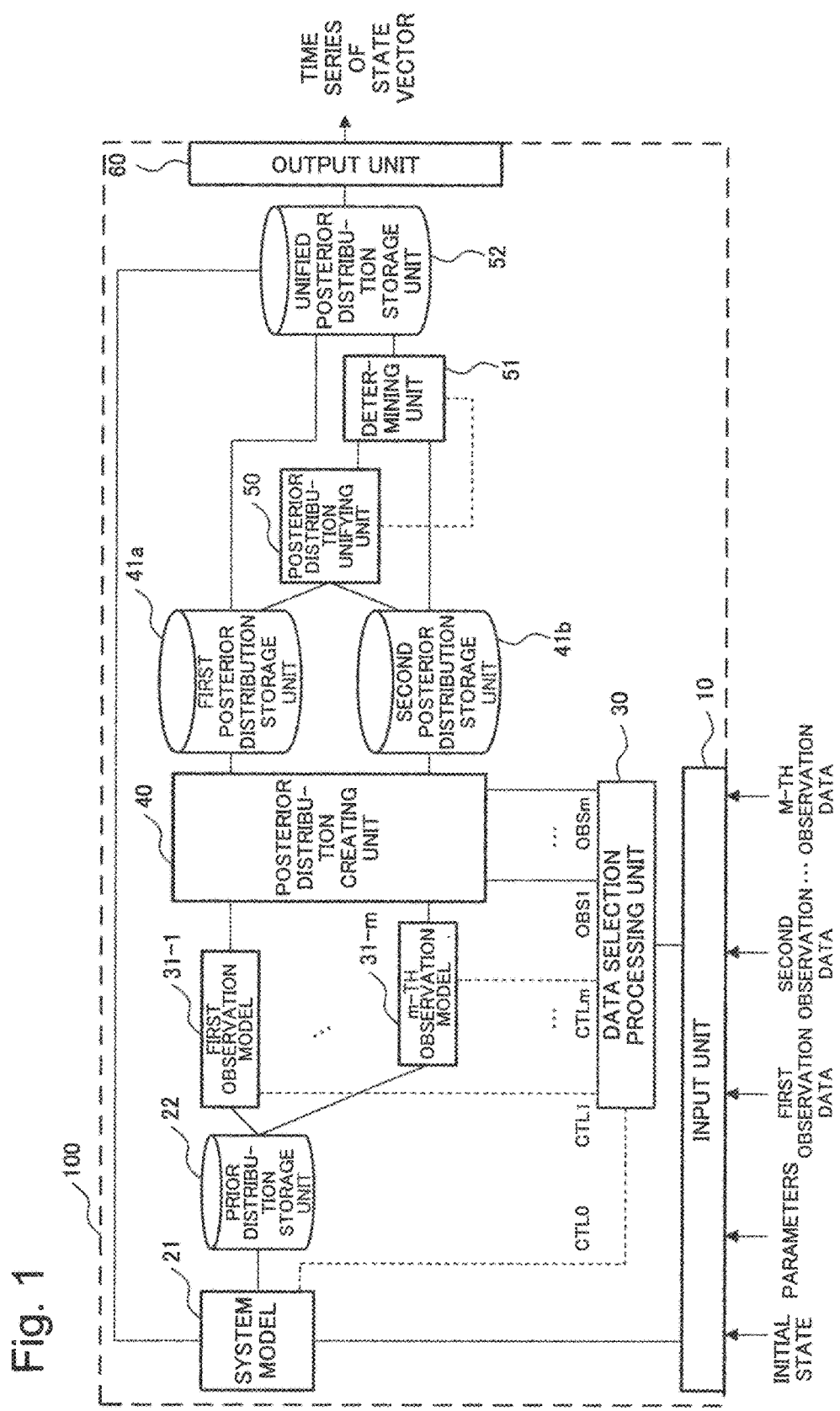
FIG. 1 is a block diagram illustrating a configuration of a simulation device as a first example embodiment of the present invention.

First, a configuration of the simulation device 100 is illustrated in FIG. 1. In FIG. 1, the simulation device 100 includes a system model 21, a data selection processing unit 30, m observation models 31 (a first observation model 31-1 to a m-th observation model 31-m), a posterior distribution creating unit 40, a posterior distribution unifying unit 50, and a determining unit 51. The simulation device 100 also includes an input unit 10 and an output unit 60. In the above description, m is an integer not smaller than 2 and not larger than M, where M is an integer not smaller than 2. In FIG. 1, the simulation device 100 also includes a prior distribution storage unit 22, a first posterior distribution storage unit 41a, a second posterior distribution storage unit 41b, and a unified posterior distribution storage unit 52, as storage areas storing data that are input and output among the functional blocks. The prior distribution storage unit 22 is included in an example embodiment of a portion of a system model of the present invention. In addition, the first posterior distribution storage unit 41a and the second posterior distribution storage unit 41b are included in an example embodiment of a portion of a posterior distribution creating unit of the present invention. Further, the unified posterior distribution storage unit 52 is included in an example embodiment of a portion of a posterior distribution unifying unit of the present invention.

Figure 2:
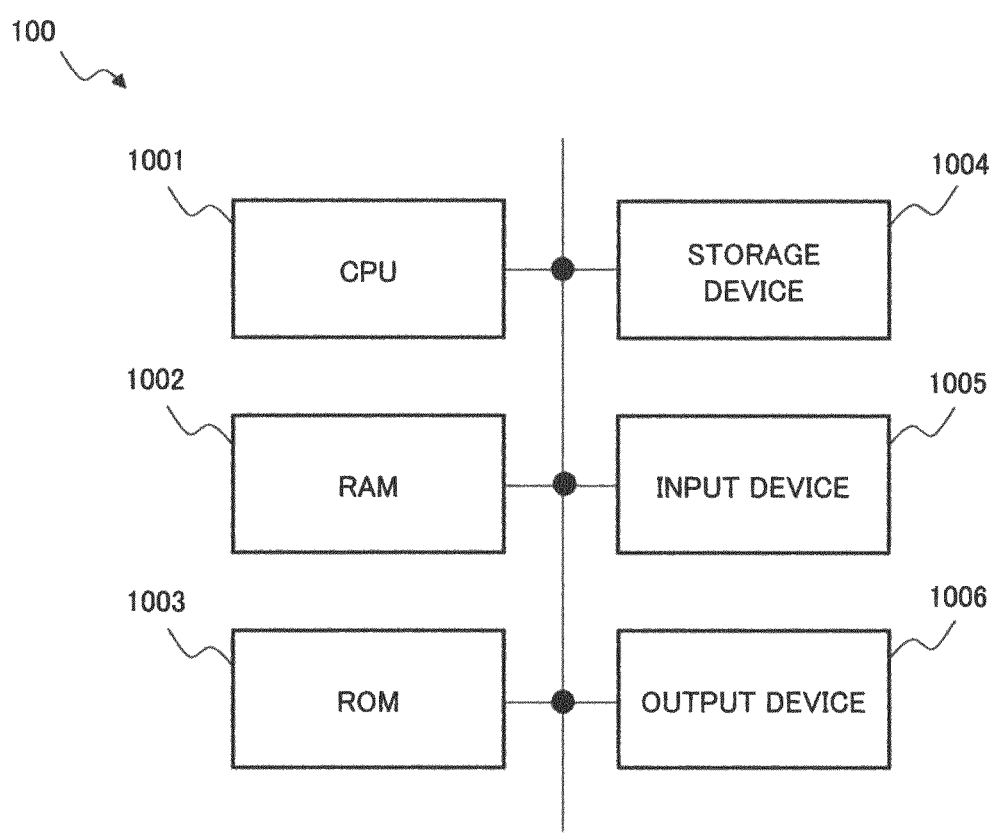
FIG. 2 is a block diagram illustrating an example of a hardware configuration of the simulation device as the first example embodiment of the present invention.

An example of a hardware configuration of the simulation device 100 is illustrated in FIG. 2. In FIG. 2, the simulation device 100 is configured using a CPU (Central Processing Unit) 1001, a RAM (Random Access Memory) 1002, a ROM (Read Only Memory) 1003, a storage device 1004, such as a hard disk, an input device 1005, and an output device 1006. In this case, the input unit 10 is configured using the input device 1005 and the CPU 1001 that loads and executes, in the RAM 1002, a computer program stored in the ROM 1003 or the storage device 1004. The system model 21, the data selection processing unit 30, the observation models 31, the posterior distribution creating unit 40, the posterior distribution unifying unit 50, and the determining unit 51 are configured as follows. That is, these functional blocks are configured using the CPU 1001 that loads and executes, in the RAM 1002, a computer program stored in the ROM 1003 or the storage device 1004. The output unit 60 is configured using the output device 1006 and the CPU 1001 that loads and executes, in the RAM 1002, a computer program stored in the ROM 1003 or the storage device 1004. The hardware configurations of the simulation device 100 and the respective functional blocks thereof are, however, not limited to the above-described configurations.

Next, details of each of the functional blocks of the simulation device 100 will be described.

First, the input unit 10 will be described. The input unit 10 obtains an initial state of a state vector and parameters in an observation domain over which simulation is to be performed and M types of observation data (first to M-th sets of observation data). Each of the M types of observation data are observation values from a sensor and the like. Each of the M types of observation data may have a different number of dimensions from or the same number of dimensions as that/those of a part or all of the other observation data. The input unit 10 may, for example, obtain the above-described information stored in the storage device 1004. The input unit 10 may also obtain the above-described information by obtaining storage position information thereof in the storage device 1004 via the input device 1005.

Next, the system model 21 will be described. The system model 21 simulates time evolutions of the state vector on the basis of the initial state and parameters obtained by the input unit 10. While the time evolution of an actual phenomenon subject to simulation is expressed by a continuous time-space partial differential equation, in order to perform simulation, a domain over which the simulation is performed needs to be discretized in time and space. The simulation device 100 uses a state vector, which is generated from a combination of state variables, to follow time evolutions of an actual phenomenon in an observation domain. The number of state variables may be defined in accordance with the purpose of the simulation and be set to any number. In the present example embodiment, a description will be made mainly on an example in which the number of state variables is two. In this case, two state variables U and V are also denoted, using a vector $\xi$, by $\xi=(U, V)$.

The discretization in time is achieved by advancing a step from a state variable $\xi t$ at a time t and calculating a state variable $\xi t+1$ at a time t+1. In the following description, a time indicates a step in a simulation, and, for example, a time t−1 means the step one step before a time t. Hereinafter, a step in a simulation is also referred to as a time step.

The discretization in space is achieved by assuming that a two-dimensional space is divided into a grid shape and denoting a state variable that is defined at a k-th grid point counting from a reference point and at a time t by $(\xi_k)t$. In the denotation, $\xi_k$ is denoted as $\xi_k=(U_k, V_k)$. In other words, a state vector is generated from state variables at respective grid points discretized within a domain over which a simulation is performed. When it is assumed that the last grid point number among the grid point numbers representing a domain over which a simulation is performed is denoted by L, a combination of state variables at a time t is denoted by a state vector $X_t$, which is expressed by the expression (1) below:

$$X_t=[\xi_1, \ldots, \xi_k, \ldots, \xi_L]_t^T=[(U_1, V_1), \ldots, (U_k, V_k), \ldots, (U_L, V_L)]_t^T \quad (1).$$

The sign T in the expression denotes transposition. The number of dimensions of the state vector is calculated as the product of the number of state variables per grid point and the number L of grid points. In the case of the expression (1), the state vector is a 2L dimensional vector.

The system model 21 performs an updating operation of a state vector $X_{t-1}$ at a time t−1 to a state vector $X_t$ at a time t in the discretized time and space. When it is assumed that a mapping representing the updating operation is denoted by f, the system model 21 is described by a relational expression expressed by the expression (2) below:

$$X_t=f(X_{t-1},\theta,v_t) \quad (2).$$

Here, $\theta$ denotes a parameter vector including various parameters required for calculation in the model. In addition, $V_t$ denotes a system noise at the time t. The system noise $V_t$ is introduced, in order to numerically express an effect of incompleteness in the model, as a stochastic driving term that has an effect on the state vector. The mapping f may be linear or non-linear depending on a target phenomenon. As is obvious from the expression (2), the state vector $X_t$ at the time t does not have to be defined explicitly with the state vector $X_{t-1}$ at the time t−1. That is, the system model 21 of the present example embodiment may calculate the state vector $X_t$ at the time t using the state vector $X_{t-1}$ at the time t−1 as input.

The updating operation, by the system model 21, from a state vector at a time t−1 to a state vector at a time t will be described in detail below. First, ensemble approximation for coping with a simulation having incompleteness will be described. Hereinafter, in reflection of incompleteness of the mapping f and incompleteness in the parameter $\theta$ to be input, the state vector $X_t$ and the system noise $V_t$ in the system model 21 are treated as, instead of definite values $X_t$ and $V_t$, probability distributions $p(X_t)$ and $p(V_t)$, respectively. Approximating the probability distributions $p(X_t)$ and $p(V_t)$ by sets of N ensembles i:

$$\{X_{t-1}^{(i)}\}_{i=1}^N, \{v_{t-1}^{(i)}\}_{i=1}^N \quad (3),$$

respectively, is referred to as ensemble approximation. Therefore, the system model 21 in an actual simulation calculates a time evolution of each ensemble i:

$$X_t^{(i)}=f(X_{t-1}^{(i)},\theta,v_t^{(i)}) \quad (4)$$

for all ensembles. From this calculation, the probability distribution $p(X_t)$ of the state vector $X_t$ at the time t is approximated by N ensembles:

$$\{X_t^{(i)}\}_{i=1}^N \quad (5).$$

The ensemble calculation expressed by the expression (4) is characterized by being independent with respect to each ensemble. Therefore, the system model 21 may not only repeat calculation N times but also perform calculation once using N parallel processors, and may change calculation methods flexibly depending on calculation resources. Hereinafter, the probability distribution of the state vector $X_t$ is denoted by $p(X_t)$ and also referred to as a prior distribution.

As described above, using the system model 21 independently for each ensemble enables the probability distribution $p(X_t)$ of the state vector at the time t to be calculated from the probability distribution $p(X_{t-1})$ of the state vector at the time t−1. The system model 21 outputs the calculated probability distribution $p(X_t)$, as a prior distribution, to the m observation models 31, which will be described later. The system model 21 may, for example, store the calculated prior distribution $p(X_t)$ in the prior distribution storage unit 22 or the like, which is readable by the m observation models 31.

Next, the data selection processing unit 30 and the observation models 31 will be described. The data selection processing unit 30 selects m types of plural pieces of observation data to be used out of the first to M-th sets of observation data on the basis of information relating to the state vector. The data selection processing unit 30 outputs the selected m types of observation data to the posterior distribution creating unit 40, which will be described later.

In the present example embodiment, it is assumed that information relating to the state vector is input from the system model 21 to the data selection processing unit 30 as a control signal CTL0. The control signal CTL0 may include, for example, the number of dimensions of the state vector $X_t$ and other information relating to the state variables. On the basis of the information included in the control signal CTL0, the data selection processing unit 30 selects m types of observation data $OBS_1$ to $OBS_m$ at a time t, which are to be used. The data selection processing unit 30 outputs the selected sets of observation data $OBS_1$ to $OBS_m$ to the posterior distribution creating unit 40.

The data selection processing unit 30 may create m observation models 31 each of which corresponds to one of the selected m types of observation data by comparing information on the state vector set by the system model 21 with the respective types of observation data (for example, physical quantities and dimensions). The data selection processing unit 30 may, for example, create the m observation models 31 using m control signals CTL1 to CTLm for relating the state vector $X_t$ with the sets of observation data $OBS_1$ to $OBS_m$.

The creation of the observation models 31 described above is to create an observation model equation that relates the state vector $X_t$ with the sets of observation data $OBS_1$ to $OBS_m$. Such relations between the state vector and the sets of observation data are illustrated schematically in FIG. 3. An observation model equation expressing such relations is expressed by, for example, the expression (6) below:

$$\begin{pmatrix} h_1 E_1 \\ h_2 E_2 \\ \vdots \\ h_m E_m \end{pmatrix} (X_t) + \begin{pmatrix} w_1 \\ w_2 \\ \vdots \\ w_m \end{pmatrix} = \begin{pmatrix} h_1 E_1 \\ h_2 E_2 \\ \vdots \\ h_m E_m \end{pmatrix} \begin{pmatrix} U_1 \\ V_1 \\ U_2 \\ V_2 \\ \vdots \\ U_L \\ V_L \end{pmatrix}_t + \begin{pmatrix} w_1 \\ w_2 \\ \vdots \\ w_m \end{pmatrix} = \begin{pmatrix} OBS_1 \\ OBS_2 \\ \vdots \\ OBS_m \end{pmatrix}_t. \quad (6)$$

In this case, the data selection processing unit 30 may output information on mappings $h_1$ to $h_m$, and noise amounts $w_1$ to $w_m$, which are to be taken into consideration in the respective sets of observation data, in the expression (6) to the observation models 31-1 to 31-m as the control signals CTL1 to CTLm, respectively. From this processing, the m observation models 31 are created.

If it is assumed that the sets of observation data are ideally obtained at all grid points 1 to L, each of the noise amounts $w_1$ to $w_m$, and the sets of observation data $OBS_1$ to $OBS_m$ in the expression (6) is an L-dimensional column vector. On the basis of a variance value and noise amount of each set of observation data, the data selection processing unit 30 may set the noise amount in the observation models 31 related to the set of observation data.

In the expression (6), $E_1$ to $E_m$ are matrices that associate the grid points 1 to L of the system model 21 with resolutions of observation points at which the sets of observation data are actually obtained. For example, when it is assumed that the number of variables in a state variable $\xi_k=(U_k, V_k)$ at each grid point k in the state vector $X_t$ is two, each of the matrices $E_1$ to $E_m$ is an at most 2L×2L dimensional matrix.

In general, in a state variable $\xi_k=(U_k, V_k)$ at a grid point k, $U_k$ and $V_k$ are physical quantities that differ from each other. Thus, relations between $U_k$ and observation data and between $V_k$ and the observation data are not able to be defined by mappings $h_1$ to $h_m$ of an identical observation model equation. The following description will thus be made using a configuration for $U_k$ (k=1 to L) in the state variables as an example. In this case, each of the above-described matrices $E_1$ to $E_m$ is a 2L×L dimensional matrix. For example, it is assumed that the set of observation data $OBS_1$ is obtained with respect to all the grid points 1 to L of the system model 21. In this case, $E_1$ is a 2L×L dimensional matrix and takes the form of a matrix expressed by the expression (7) below:

$$E_1 = \begin{pmatrix} 1 & 0 & 0 & 0 & 0 & \ldots & 0 & 0 \\ 0 & 0 & 1 & 0 & 0 & \ldots & 0 & 0 \\ 0 & 0 & 0 & 0 & 1 & \ldots & 0 & 0 \\ \vdots & & & & & \ddots & & \\ 0 & 0 & 0 & 0 & 0 & \ldots & 1 & 0 \end{pmatrix}. \quad (7)$$

In the matrix, only the element at the j-th (j is an integer not smaller than 1 and not larger than L) row and $\{1+2(j-1)\}$th column has a value of 1.

Figure 3:
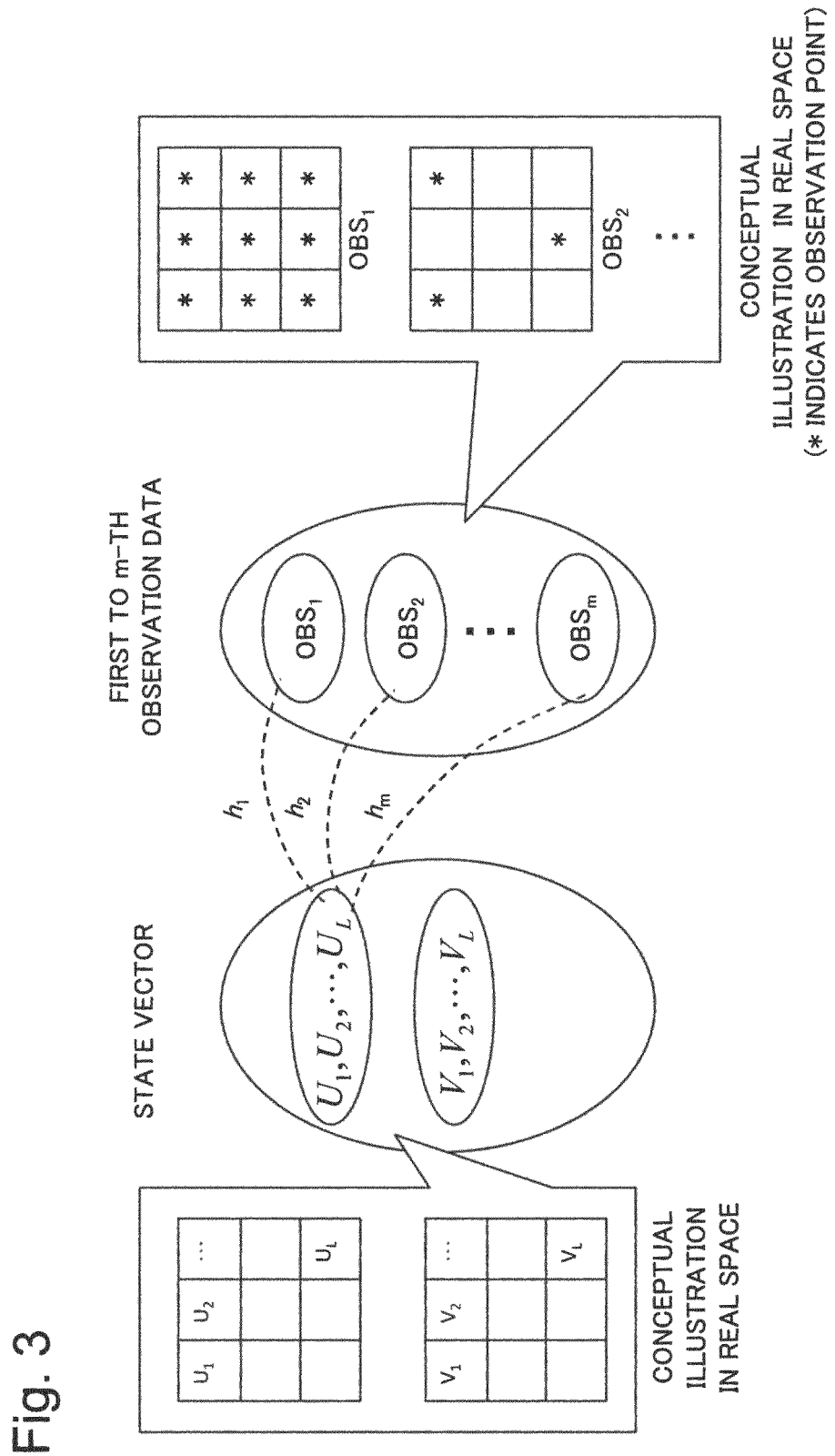
FIG. 3 is a diagram schematically illustrating a relationship between a state vector and sets of observation data in the simulation device as the first example embodiment of the present invention.

A case in which no data is observed at some grid points in the grid points 1 to L, as the set of observation data $OBS_2$ illustrated in FIG. 3, is considered. A sign "*" indicates a grid point at which a piece of data is observed (observation point). In this case, the matrix $E_2$ is represented by a matrix that is obtained by changing the values of the elements in the row, in the expression (7), corresponding to a grid point at which no data is observed to a value of 0. In this case, on the left side of the expression (6), the number of dimensions on which $h_2$ acts becomes smaller than L, and becomes the same number of dimensions as that of the set of observation data $OBS_2$. In the case in which, for example, J state variables are defined, as $(U_k, V_k, \ldots, Z_k)$, at a grid point k, only the element at the j-th row and $\{1+J(j-1)\}$th column in the expression (7) has a value of 1. Therefore, the matrices $E_1$ to $E_m$ can be expressed regardless of the number of state variables. The mappings $h_1$ to $h_m$ in the expression (6) may be linear or non-linear depending on relations between the state variables and the sets of observation data. Therefore, an arithmetic operation expressed by the expression (6) can be expressed such that, in the case of, for example, the j-th observation model 31-j, when the state vector $X_t$ at a time t, calculated by the expression (4), is input, the model outputs:

$$H_j(X_t, w_j) = h_j E_j X_t + w_j \quad (8).$$

Thus, all the m types of observation models 31 individually perform the arithmetic operation expressed by the expression (8) on the state vector $X_t$, and output all the m types of transformed state vectors $X_t$ to the posterior distribution creating unit 40. A combination of the expression (2) or the expression (4) and the expression (8) is referred to as a state space model.

Although, in the above-described example of $E_1$ to $E_m$, a case in which the grid points (L-dimensional) of the system model 21 and the grid points (L-dimensional) of the observation model coincide with each other is assumed, a case of noncoincidence is also conceivable practically. In such a case, the values of the respective elements of the matrices $E_1$ to $E_m$ may be changed in such a way that each observation point at which a piece of observation data is actually obtained has, for example, a weighted average of values at neighboring grid points. As described above, the above-described $E_1$ to $E_m$ express operations of relating the grid points of the state variables with degrees of resolution of observation points for a plurality of pieces of observation data in a manner of one-to-one, weighted average, weighted sum, or the like with respect to each piece of observation data.

As described above, each of the m observation models 31 related to one of the m sets of observation data selected by the data selection processing unit 30. Each of the observation model 31 transforms a state vector output from the system model 21 into a predetermined state vector on the basis of the expression (8), which expresses a relationship between a set of observation data and a state vector. Each of the observation model 31 outputs the transformed state vector to the posterior distribution creating unit 40. The transformed state vectors have prior distributions of m types of transformed state vectors $X_t$ at a time t.

On the basis of state vectors output from the m observation models 31 and sets of observation data selected by the data selection processing unit 30, the posterior distribution creating unit 40 creates posterior distributions of the state vector. The posterior distribution creating unit 40 categorizes, in the created posterior distributions, a posterior distribution based on all the m types of observation data, selected by the data selection processing unit 30, as a first posterior distribution. The posterior distribution creating unit 40 also categorizes a posterior distribution based on observation data that lack one or more types of observation data out of the m types of observation data, selected by the data selection processing unit 30, as a second posterior distribution. The posterior distribution creating unit 40 outputs the created first posterior distribution and second posterior distribution to the posterior distribution unifying unit 50 and the like. For example, the posterior distribution creating unit 40 may store the created first posterior distribution in the first posterior distribution storage unit 41a that is readable by the posterior distribution unifying unit 50 and the like. The posterior distribution creating unit 40 may also store the created second posterior distribution in the second posterior distribution storage unit 41b that is readable by the posterior distribution unifying unit 50 and the like. The posterior distribution creating unit 40 also outputs the created first posterior distribution to the system model 21 and the output unit 60. In this case, for example, the posterior distribution creating unit 40 may store the created first posterior distribution in the unified posterior distribution storage unit 52 that is readable by the system model 21 and the output unit 60.

Here, the creation processing of posterior distributions by the posterior distribution creating unit 40 will be described in detail. To the posterior distribution creating unit 40, prior distributions of m types of transformed $X_t$ at a time t and the sets of observation data $OBS_1$ to $OBS_m$ are input. In general, a posterior distribution p(x|y) when a prior distribution p(x) and a distribution p(y) of observation data are input is, according to Bayes' theorem, expressed by the expression:

$$p(x \mid y) = \frac{p(y \mid x)p(x)}{p(y)}. \tag{9}$$

In the expression (9), p(y|x) in the numerator is referred to as a likelihood, which is an indicator of the goodness of fit of a state variable x to an observation value y. In the case in which an observation model 31 can be separated into a mapping h and a noise amount w, as expressed by the expression (8), for the likelihood p(y|x), a quantity calculated by the expression:

$$p(y \mid x) = r(y - h(x)) \left| \frac{\partial (y - h(x))}{\partial y} \right| \equiv LH(y - h(x)) \tag{10}$$

can be used. In the expression (10), r is the density function of the noise amount w. In the expression (10), the right side is redefined as a function LH of y and h(x). Further, a likelihood $p(y_{1:m}|x)$ in the case of m types of observation values $y=\{y_1, y_2, \ldots, y_m\}$ being obtained is, using a multiplication theorem recursively, expressed in a product form as:

$$\begin{aligned} p(y_{1:m} \mid x) &= p(y_m \mid y_{1:m-1}, x)p(y_{1:m-1} \mid x) = \\ &\prod_i^m p(y_i \mid y_{1:i-1}, x) \\ &= p(y_1 \mid y_{1:0}, x)p(y_2 \mid y_{1:1}, x) \\ &\quad p(y_3 \mid y_{1:2}, x) \ldots p(y_m \mid y_{1:m-1}, x). \end{aligned} \tag{11}$$

In the expression (11), the first term $p(y_1|y_{1:0}, x)$ is the probability of $y_1$ when there is no observation data, that is, the likelihood $p(y_1|x)$ of x when $y_1$ is obtained. The second term $p(y_2|y_{1:1}, x)$ is the probability of $y_2$ when $y_1$ is obtained. However, the respective observation data are collected using separate sensors or the like, and no joint distribution of $y_1$ and $y_2$ exists. Thus, the second term, as a result, becomes the likelihood $p(y_2|x)$ of x when $y_2$ is obtained. Therefore, the posterior distribution expressed by the expression (9) in this case is expressed by the expression:

$$p(x \mid y_{1:m}) = \frac{p(y_1 \mid x)p(y_2 \mid x) \ldots p(y_m \mid x)p(x)}{Z}. \tag{12}$$

In the expression (12), it is assumed that Z in the denominator is a normalization constant. If this relation is used, because of m types of observation data y having been obtained as $OBS_1$ to $OBS_m$, the posterior distribution of the state variable $U_k$ at a grid point k is, assuming the prior distribution of $U_k$ being denoted by $p(U_k)$, expressed by the expression:

$$p(U_k \mid OBS_{1:m}) = \frac{p(OBS_1 \mid U_k)p(OBS_2 \mid U_k) \ldots p(OBS_m \mid U_k)p(U_k)}{Z}. \tag{13}$$

The numerator is, as expressed by the expression (12), the product of the product of the likelihoods based on the respective sets of observation data and the prior distribution $p(U_k)$. Further, since each likelihood is expressed by the expression (10), the posterior distribution of the expression (13) is expressed by the expression:

$$p(U_k \mid OBS_{1:m}) = \frac{LH(OBS_1 - H_1(U_k))LH(OBS_2 - H_2(U_k)) \ldots LH(OBS_m - H_m(U_k))p(U_k)}{Z}. \tag{14}$$

As described above, the posterior distribution creating unit 40 calculates the posterior distribution of the state variable $U_k$ at a grid point k on the basis of m types of likelihoods LH, which are calculated on the basis of m sets of observation data $OBS_1$ to $OBS_m$ and the mappings $h_1$ to $h_m$, and the prior distribution $p(U_k)$. In a similar manner, the posterior distribution creating unit 40 calculates posterior distributions with respect to all the grid points 1 to L using the expression (13), that is, the expression (14).

However, the posterior distribution creating unit 40 uses the expression (15) below in place of the expression (13) with respect to a grid point at which one or more types of observation data in the m types of observation data are missing. For example, as $OBS_2$ illustrated in FIG. 3, there is a case in which observation data have been obtained only at a portion of the grid points. In this case, the posterior distribution creating unit 40 is unable to calculate the product of the likelihoods with respect to all the observation data, as expressed in the numerator of the expression (13). For example, if a case in which, at a grid point k', only m−1 types of observation data are obtainable is assumed, the posterior distribution is expressed by the expression:

$$p(U_{k'} \mid OBS_{1:m-1}) = \qquad (15)$$

$$\frac{p(OBS_1 \mid U_{k'})p(OBS_2 \mid U_{k'})\ldots p(OBS_{m-1} \mid U_{k'})p(U_{k'})}{Z'}, \text{ that is,}$$

$$p(U_{k'} \mid OBS_{1:m-1}) = \frac{LH(OBS_1 - H_1(U_{k'}))LH(OBS_2 - H_2(U_{k'}))\ldots LH(OBS_{m-1} - H_{m-1}(U_{k'}))p(U_{k'})}{Z'}, \qquad (16)$$

and the number of likelihoods included in the numerator decreases to m−1. In the expression (15) and the expression (16), the expression "m−1" indicates that at least one type of observation data in the m types of observation data have not been obtained and does not limit the number of types of observation data that have not been obtained (are missing) to one.

As described above, the posterior distribution creating unit 40 creates a posterior distribution for each of the state variables at each of the grid points. Hereinafter, the posterior distribution for each of the state variables at each of the grid points is also referred to as a posterior distribution with respect to each combination of a state variable and a grid point. The posterior distribution creating unit 40 outputs a posterior distribution calculated on the basis of all the observation data using the expression (13) as a first posterior distribution. The posterior distribution creating unit 40 also outputs a posterior distribution calculated on the basis of observation data that lack at least one type of observation data in the m types of observation data using the expression (15) as a second posterior distribution.

It is now assumed that a prior distribution p(x) follows a normal distribution with a mean μ0 and a variance $V_{prio}$, and n observation values $y_1, Y_2, \ldots, y_n$ also follow a normal distribution with a mean μ and a variance V. In this case, the posterior distribution p(x|y), which is calculated according to Bayes' theorem expressed by the expression (9), also becomes a normal distribution, and the variance $V_{post}$ thereof is expressed by the expression:

$$V_{post} = \frac{1}{\frac{n}{V} + \frac{1}{V_{prio}}}. \qquad (17)$$

This indicates that, as the number of observation values used for calculation of the posterior distribution increases, the variance decreases, that is, the accuracy of the posterior distribution improves.

While a first and a second posterior distribution are not always normal distributions individually, smaller pieces of observation data are taken into a second posterior distribution than those into a first posterior distribution. Thus, the variance of the first posterior distribution $P(U_k|OBS_{1:m})$ of the expression (13) and the variance of the second posterior distribution $p(U_{k'}|OBS_{1:m-1})$ of the expression (15) are respectively denoted by $\text{Var}(p(U_k|OBS_{1:m}))$ and $\text{Var}(p(U_{k'}|OBS_{1:m-1}))$. Then, an inequality expressed by the expression (18) below holds:

$$\text{Var}(p(U_k|OBS_{1:m})) \leq \text{Var}(p(U_{k'}|OBS_{1:m-1})) \qquad (18).$$

Next, the posterior distribution unifying unit 50 will be described. The posterior distribution unifying unit 50 unifies a first posterior distribution and a second posterior distribution. More specifically, the posterior distribution unifying unit 50 calculates a new posterior distribution for each combination of a state variable and a grid point for which the second posterior distribution has been calculated by unifying the first posterior distribution and the second posterior distribution into the new posterior distribution. The posterior distribution unifying unit 50 outputs the new posterior distribution after unification to the determining unit 51. Since, in the present example embodiment, a posterior distribution is approximated by a set of ensembles, the posterior distribution unifying unit 50 may perform the unification by means of superposing ensembles approximating a first posterior distribution and ensembles approximating a second posterior distribution at a predetermined ratio.

Specifically, the posterior distribution unifying unit 50 obtains the afore-described first posterior distributions and second posterior distributions as input from the first posterior distribution storage unit 41*a* and the second posterior distribution storage unit 41*b*. Because of the relation expressed by the expression (18), $p(U_{k'}|OBS_{1:m-1})$, which is one of the second posterior distributions, has a larger variance (that is, lower accuracy) than does at least $p(U_k|OBS_{1:m})$, which is one of the first posterior distributions. Thus, the posterior distribution unifying unit 50 calculates a new posterior distribution for each combination of a state variable and a grid point for which the second posterior distribution has been calculated by unifying the first posterior distribution and another second posterior distribution into a new post-posterior distribution. For example, it is assumed that, with respect to a grid point j, a second posterior distribution $p(U_j|OBS_{1:m-1})$ has been calculated. In this case, with respect to the grid point j, the posterior distribution unifying unit 50, assuming that g is a function, calculates a new posterior distribution $p'(U_j|OBS_{1:m})$ by the expression (19) below:

$$p'(U_j|OBS_{1:m}) = g(p(U_k|OBS_{1:m}), p(U_i|OBS_{1:m-1}), \pi) \qquad (19).$$

Here, π denotes a parameter set that determines the function g. In addition, k denotes a grid point at which the first posterior distribution has been created. Further, i denotes another grid point at which the second posterior distribution has been created. In the expression, i≠j holds. Hereinafter, the dash (') of the probability distribution p' in the expression (19) indicates that the probability distribution p' is a probability distribution after unification performed by the posterior distribution unifying unit 50. The posterior distribution unifying unit 50 outputs the posterior distribution $p'(U_j|OBS_{1:m})$ newly calculated in such a way and the original second posterior distribution $p(U_j|OBS_{1:m-1})$ to the determining unit 51.

Next, the determining unit 51 will be described. The determining unit 51 determines which one of a second posterior distribution or a unified posterior distribution is to be used. More specifically, for each combination of a state variable and a grid point for which a second posterior distribution has been created, the determining unit 51 determines which one of the original second posterior distribution and the unified posterior distribution is to be used as a posterior distribution. Specifically, the determining unit 51 may store the determined posterior distribution in the unified posterior distribution storage unit 52. In the unified posterior distribution storage unit 52, as described above, a first posterior distribution has been stored. The storing operation causes the first posterior distribution or the determined posterior distribution to be stored in the unified posterior distribution storage unit 52 for each combination of a state variable and a grid point.

For example, the determining unit 51 may determine, on the basis of the respective variance values of a second posterior distribution and a unified posterior distribution, which one is to be used. Specifically, to the determining unit 51, the unified posterior distribution p'($U_j$|$OBS_{1:m}$), which is newly calculated by the posterior distribution unifying unit 50, and the original second posterior distribution p($U_j$|$OBS_{1:m-1}$) are input. Both of these posterior distributions are posterior distributions at a grid point j. For example, the determining unit 51 may, as with the expression (18), calculate and compare the variances of these posterior distributions. In this case, if the variance of the unified posterior distribution p'($U_j$|$OBS_{1:m}$) is smaller, the determining unit 51 selects and outputs the unified posterior distribution. The determining unit 51 also stores the selected posterior distribution in the unified posterior distribution storage unit 52.

On the other hand, if the variance of the unified posterior distribution p'($U_j$|$OBS_{1:m}$) is larger, the determining unit 51 may repeat the calculation by varying the parameter $\pi$ of the function g in the expression (19) until the variance of the unified posterior distribution becomes smaller than the variance of the original second posterior distribution. For example, in the case in which the function g is a weighted average function, the determining unit 51 may vary weighting factors thereof. The determining unit 51 may assume a prior distribution p($\pi_{prio}$) for the parameter $\pi$, and calculate a posterior distribution p($\pi_{post}$) of the parameter $\pi$ that minimizes the variance thereof by using Bayes' theorem, expressed by the expression (9), with variance values of the expression (4) treated as observation values. When varying the parameter $\pi$ results in the variance of the unified posterior distribution becoming smaller than the variance of the original second posterior distribution, the determining unit 51 selects and stores the unified posterior distribution in the unified posterior distribution storage unit 52. In the case in which varying the parameter $\pi$ does not cause the variance to be smaller, the determining unit 51 selects and stores the original second posterior distribution in the unified posterior distribution storage unit 52.

In this way, in the unified posterior distribution storage unit 52, the whole set of posterior distributions of the state variable $U_k$ at a time t at all the grid points k (k=1 to L) is completed with the first posterior distribution and the unified posterior distribution or the second posterior distribution, which has been selected by the determining unit 51.

Next, the output unit 60 will be described. In the case of continuing the simulation, the output unit 60 inputs the state vector at a time t, which generated from a posterior distribution selected by the determining unit 51 and a first posterior distribution, to the system model 21. The system model 21, using the posterior distributions at the time t, calculates prior distributions at a time t+1, which is the next time step. The output unit 60 outputs, as a result from the simulation, a time series of the state vector, which is generated from the posterior distribution selected by the determining unit 51 and the first posterior distribution, to the output device 1006 and the like.

As described above, in the unified posterior distribution storage unit 52, the whole set of posterior distributions of the state variable $U_k$ at a time t at all the grid points k (k=1 to L) is completed with the first posterior distribution and the unified posterior distribution or the second posterior distribution, which has been selected by the determining unit 51. The output unit 60 may input posterior distributions for the respective combinations of a state variable and a grid point, which are stored in the unified posterior distribution storage unit 52, to the system model 21 and output a time series thereof.

Although, as described thus far, the configurations of the respective functional blocks are described using the state variables $U_k$ (k=1 to L) as an example, the respective functional blocks are configured in the same manner with respect to other state variables (for example, $V_k$ (k=1 to L)).

An operation of the simulation device 100 configured as described above will be described with reference to the drawings.

Figure 4:
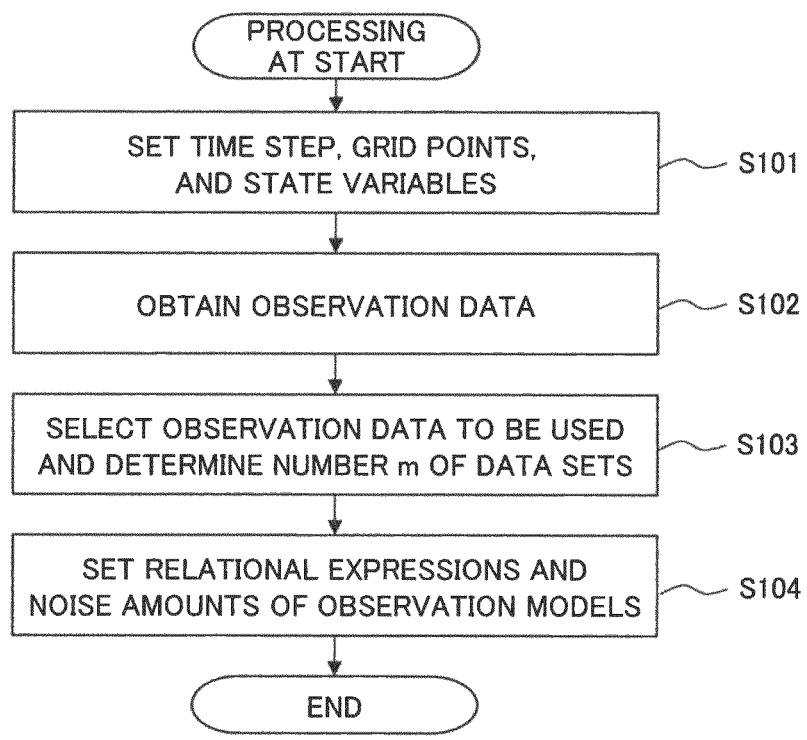
FIG. 4 is a flowchart explaining an operation at the start of a simulation of the simulation device as the first example embodiment of the present invention.

First, an operation that the simulation device 100 performs at the start of a simulation will be described using FIG. 4. In FIG. 4, a time at which the simulation starts is assumed to be a basis for the following steps, that is, a time t=1.

In FIG. 4, to perform a simulation discretized in time and space, the system model 21 first determines a time step, grid points, and state variables to simulate the time evolutions thereof (step S101). For example, for the time step and the grid points, appropriate values may be chosen on the basis of required accuracy or so that the calculation converges.

Next, the input unit 10 obtains first to M-th sets of observation data (step S102).

Next, referring to the information on the state variables set by the system model 21, the data selection processing unit 30 selects m types of observation data to be used from the first to M-th sets of observation data (step S103).

Next, the data selection processing unit 30 sets a relational expression relating the state variables and the m types of observation data with each other and noise amounts included therein, and creates the observation models 31-1 to 31-m (step S104). For example, the data selection processing unit 30 may set the relational expression and noise amounts on the basis of types, properties, and physical quantities of the sets of observation data, the numbers of dimensions of the sets of observation data and state variables, and the like. This causes the m observation models 31 to be created.

With this processing, the simulation device 100 completes the operation performed at the start of a simulation.

Next, an operation by which the simulation device 100 performs a simulation will be described using FIG. 5.

Figure 5:
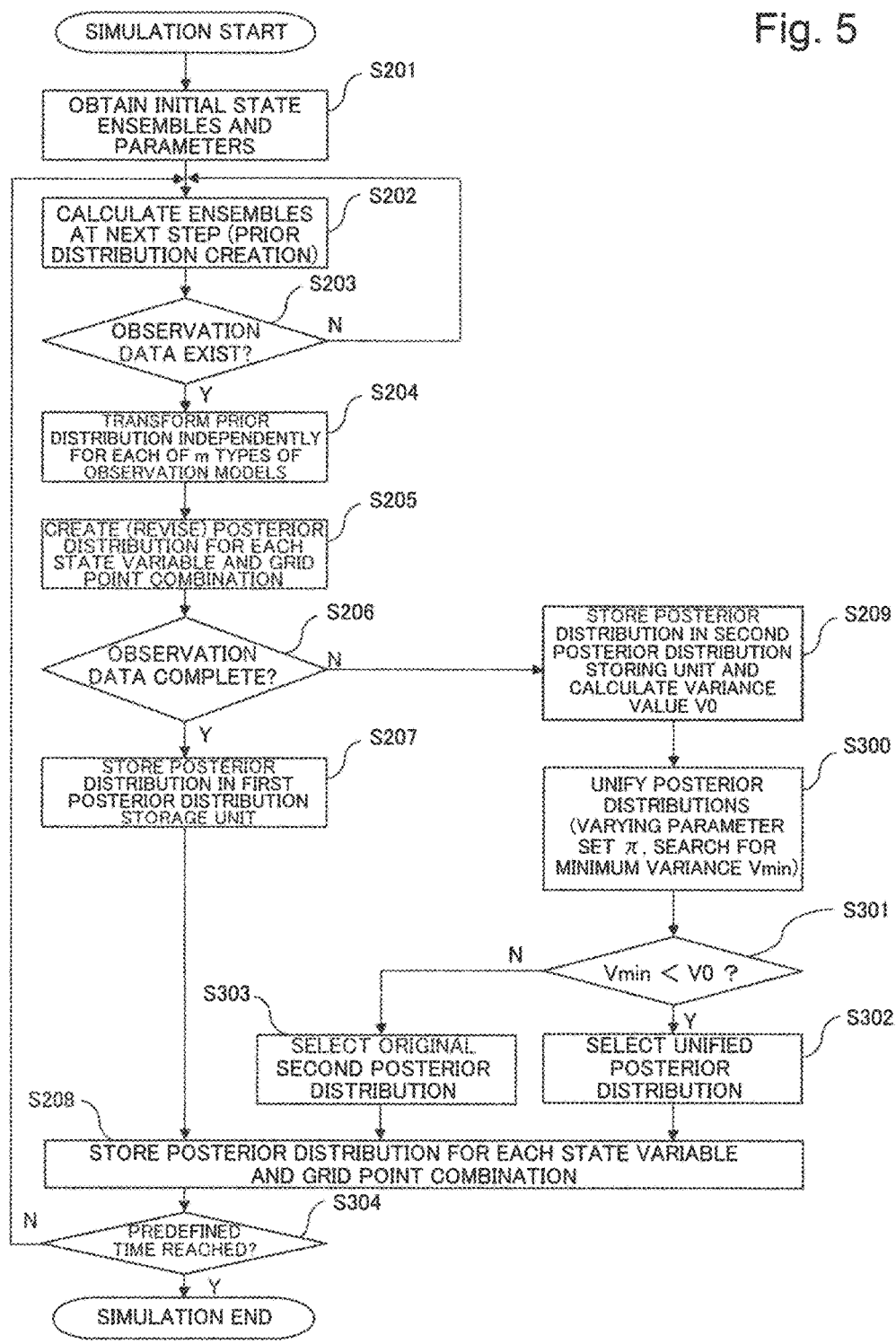
FIG. 5 is a flowchart explaining a simulation operation of the simulation device as the first example embodiment of the present invention.

In FIG. 5, the input unit 10 first obtains ensembles representing an initial state of the state vector and parameters, and outputs the obtained ensembles and parameters to the system model 21 (step S201).

Next, the system model 21 calculates ensembles at a next time step, that is, prior distributions, and stores the calculated prior distributions in the prior distribution storage unit 22 (step S202).

The input unit 10 now determines whether or not at least any of the first to m-th sets of observation data is obtained at the time of this time step (step S203).

In the case in which no observation data is obtained (No in step S203), the system model 21, using the prior distributions at the next time step, which is stored in the prior distribution storage unit 22, performs step S202 again and performs calculation of advancing one more time step.

It is assumed that it is also determined No in step S203 in the case of being specified not to revise data at this time step even when any set of observation data is obtained.

On the other hand, in the case in which at least any of the first to m-th sets of observation data is obtained and data are to be revised (Yes in step S203), each of the observation models 31-1 to 31-m transforms prior distributions stored in the prior distribution storage unit 22 (step S204).

At this time, in an identical simulation, the observation models created in step S104 at the start of the simulation are basically used as the observation models 31-1 to 31-m. However, even in an identical simulation, in an exceptional case, such as a case in which the behavior of observation data substantially changes and a case in which simulation calculation does not work well, the afore-described step S104 may be performed again. In this case, in this step S204, transformation may be performed using newly-created m observation models 31.

Next, the posterior distribution creating unit 40 creates a posterior distribution for each combination of a state variable and a grid point on the basis of the created m types of transformed prior distributions and the m types of observation data at the time of this time step (step S205). This operation causes the original prior distributions to be revised.

Next, the posterior distribution creating unit 40 determines whether the posterior distribution, created in step S205, for each combination of a state variable and a grid point is a posterior distribution based on all the m types of observation data selected in step S103 or a posterior distribution based on observation data that lack a portion of the m types of observation data (step S206).

When the posterior distribution is determined to be a posterior distribution based on all the m types of observation data, the posterior distribution creating unit 40 stores the posterior distribution, as a first posterior distribution, in the first posterior distribution storage unit 41a (step S207).

In this case, the posterior distribution creating unit 40 also stores the first posterior distribution, as a posterior distribution for the combination of a state variable and a grid point, in the unified posterior distribution storage unit 52 (step S208).

On the other hand, in step S206, when the posterior distribution is determined to be a posterior distribution based on observation data that lack a portion of the m types of observation data, the posterior distribution creating unit 40 categorizes the posterior distribution as a second posterior distribution and calculates a variance value V0 thereof (step S209). The posterior distribution creating unit 40 stores the second posterior distribution and the variance value V0 thereof in the second posterior distribution storage unit 41b.

Next, the posterior distribution unifying unit 50 calculates a new posterior distribution (unified posterior distribution) whose variance value V is minimum by, for each combination of a state variable and a grid point for which the second posterior distribution is created, unifying the first posterior distribution and the second posterior distribution (step S300).

Specifically, the posterior distribution unifying unit 50 may, for each target combination of a state variable and a grid point, calculate a unified posterior distribution repeatedly using the expression (19) and search for $\pi$ that minimizes the variance value V while varying a parameter set $\pi$. For example, the posterior distribution unifying unit 50 may perform the search using the least squares method or Bayes' theorem. A minimum value of the variance, obtained from the search, is denoted by Vmin.

Next, the determining unit 51 compares the minimum value Vmin of the variance with the variance value V0 before unification (step S301).

If the minimum value Vmin of the variance after unification is smaller, the determining unit 51 sets the unified posterior distribution as a new posterior distribution for the combination of a state variable and a grid point (step S302), and stores the unified posterior distribution in the unified posterior distribution storage unit 52 (step S208).

On the other hand, if the minimum value Vmin of the variance after unification does not become smaller, the determining unit 51 discontinues the unification, sets the second posterior distribution as a posterior distribution for the combination of a state variable and a grid point (step S303), and stores the second posterior distribution in the unified posterior distribution storage unit 52 (step S208).

Next, if the simulation does not reach a predefined time or a predefined step (No in step S304), the simulation device 100 repeats the operations after step S202. That is, the system model 21 performs step S202 using, as input, posterior distributions for the respective combinations of a state variable and a grid point, stored in the unified posterior distribution storage unit 52, and starts calculation of the next step.

On the other hand, when the simulation reaches the predefined time or the predefined step (Yes in step S304), the output unit 60 outputs a time series of posterior distributions for the respective combinations of a state variable and a grid point, stored in the unified posterior distribution storage unit 52, and finishes the simulation operation.

Next, an advantageous effect of the first example embodiment of the present invention will be described.

The simulation device as the first example embodiment of the present invention may perform a high-resolution and high-accuracy simulation over a wide range taking into consideration non-ideal observation data and observation data that have a discontinuity or peculiarity.

The reasons for the above advantageous effect will be described. In the present example embodiment, the system model simulates time evolutions of the state vector. The data selection processing unit selects m types of observation data from M types of observation data. The m observation models each of which corresponds to one of the m types of observation data transform prior distributions of the state vector at a next step, which is calculated by the system model, on the basis of relationships between the m types of observation data and the state vector. Based on the transformed m types of prior distributions and the selected m types of observation data, the posterior distribution creating unit creates a posterior distribution for each combination of a state variable and a grid point. The posterior distribution creating unit categorizes, in the created posterior distributions, a posterior distribution based on all the m types of observation data as a first posterior distribution and a posterior distribution based on observation data that lack a portion of the m types of observation data as a second posterior distribution. The posterior distribution unifying unit, for each combination of a state variable and a grid point for which the second posterior distribution is created, unifies the first posterior distribution and the second posterior distribution, and creates a new posterior distribution. The determining unit determines which one of the second posterior distribution or the new posterior distribution is to be selected, and sets the determined posterior distribution as a posterior distribution after unification for the combination of a state variable and a grid point. The system model calculates the state vector at the next step using, as input, posterior distributions of the state vector, which are generated from the first posterior distribution and the unified posterior distribution.

Because of the above-described reasons, even in the case in which a portion of the observation data are inappropriate or include a lot of errors, the present example embodiment may, by unification of posterior distributions, perform revision taking into consideration other observation data. Alternatively, since such observation data come not to be used for revision, the present example embodiment may prevent an error from increasing. Since, even for observation data that have a low measurement frequency, the present example embodiment may perform revision by taking into consideration observation data that have a high measurement frequency, the present example embodiment enables simulation with higher accuracy.

Figure 6:
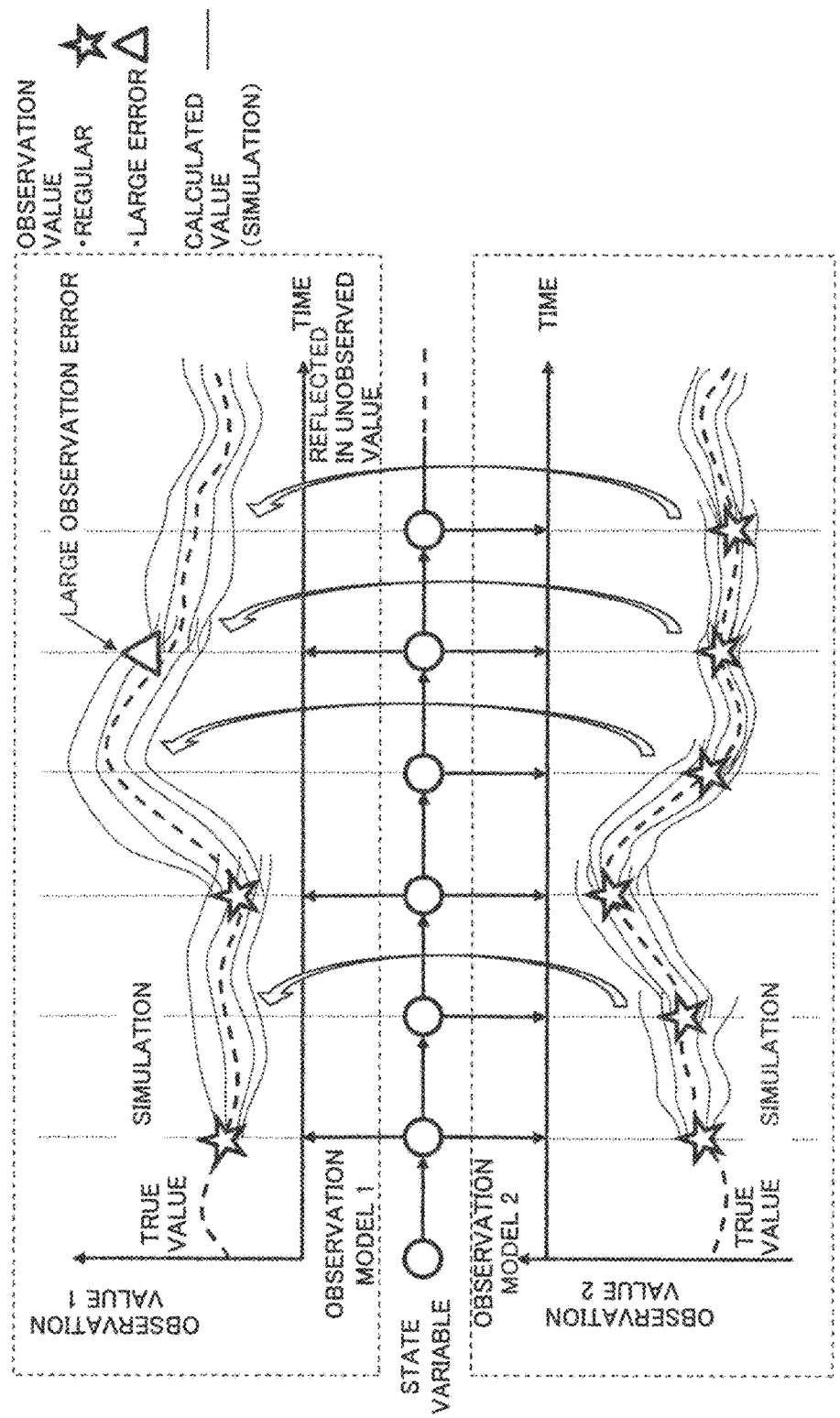
FIG. 6 is a diagram schematically explaining an advantageous effect of the first example embodiment of the present invention.

The advantageous effect as described above will be described using FIG. 6, which schematically illustrates the advantageous effect. In FIG. 6, the horizontal axis represents the time. Variables for which the time evolutions are to be calculated in a simulation model are set as state variables, and values actually measured by means of sensors and the like are set as observation values. These settings are the same as in FIG. 15, which schematically illustrates simulation by means of data assimilation of the related technology. However, in FIG. 6, a case in which two types of observation values (observation value set 1 and observation value set 2) are selected by a data processing unit is illustrated. By using m different types of observation models each of which related to one of the m types of observation data, the present example embodiment may relate different types of observation data with the same type of state variables. In FIG. 6, an observation model related to the observation value set 1 is illustrated as an observation model 1, and an observation model related to the observation value set 2 is illustrated as an observation model 2. With regard to the observation value set 1, it is assumed that observation values of the same type and the same values as those of the observation values in the simulation in FIG. 15, according to the related technology, has been obtained.

Figure 15:
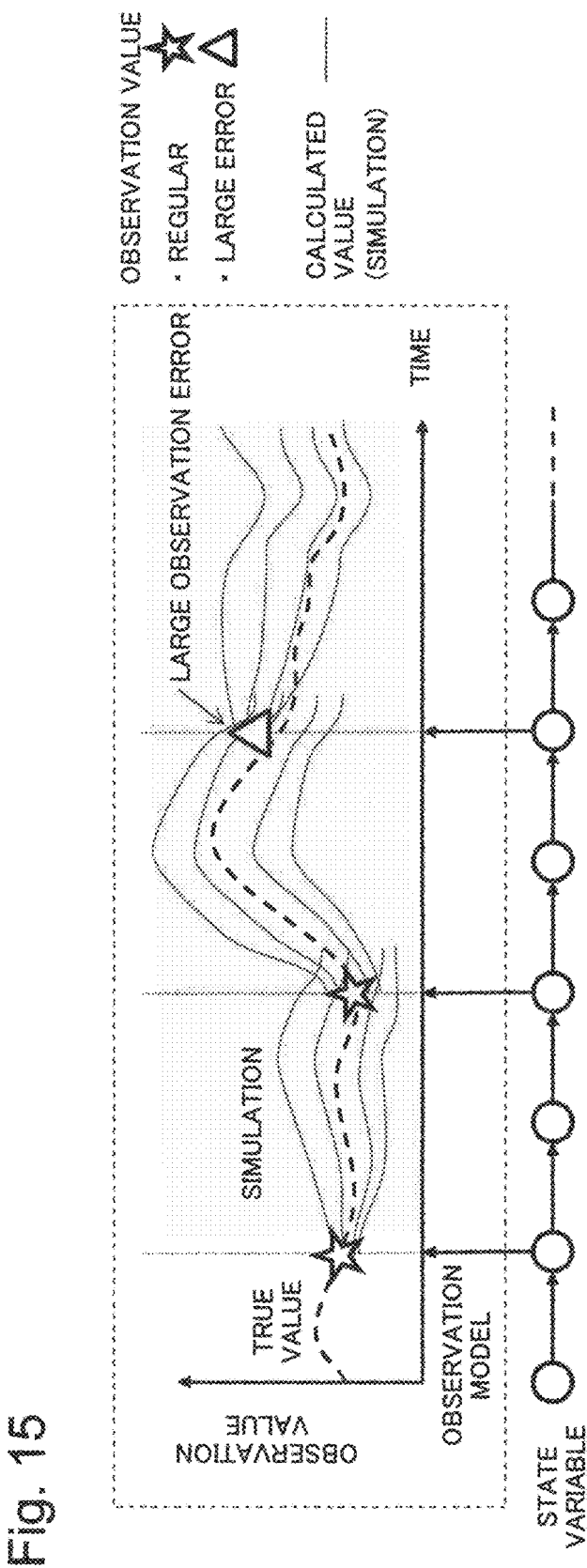
FIG. 15 is a diagram schematically illustrating simulation using data assimilation of a related technique.

Comparison between FIG. 6 and FIG. 15 indicates that, in the simulation by the related technology illustrated in FIG. 15, errors are accumulated in simulations using the observation value set 1 because of influence from the measurement frequency of the observation value set 1. In contrast, in FIG. 6, the observation value set 2 are observed in a shorter cycle in comparison with the observation value set 1. Thus, effect of revision based on observation values appears in the simulation values of the observation value set 1. That is because both simulation values of the observation value set 1 and the observation value set 2 are created from the same type of state variables, even though a difference between the observation models exists. Therefore, the present example embodiment enables simulation with higher accuracy in comparison with the related technology for not only the observation value set 2, the observation frequency of which is high, but also the observation value set 1, the observation frequency of which is low. A case in which observation values that include more inappropriate values or errors (observation value set 1 indicated by a triangle in FIG. 6) are obtained than in the case of the related technique illustrated in FIG. 15 will be described. Even in such a case, the present example embodiment may, by means of unification of posterior distributions, revise simulation values based on such the observation value set 1 with the other observation values, that is, the observation value set 2, taken into consideration, and, further, such the observation value set 1 come not to be used for revision. Therefore, the present example embodiment may prevent errors from increasing.

As described above, even when observation data that, when used alone, include only an insufficient number of pieces of data or have a distribution that is biased spatially and temporally are provided, the present example embodiment may, by using a variety of types of such observation data, enable a high-resolution and high-accuracy simulation to be performed over a wider range. In the future, due to progress in observation technologies and information collection from a large number of sensors, as in, for example, M2M (Machine-to-Machine), a larger variety of and a large quantity of observation data are expected to be collected. In such a situation in which a larger variety of and a larger quantity of data are collected, the present example embodiment may, by using information from a plurality of sets of observation data in a unifying manner, perform a more effective simulation in comparison with the related technology in which the accuracy of simulation is constrained by characteristics of observation data.

(Second Example Embodiment)

Next, a second example embodiment of the present invention will be described with reference to the drawings. The present example embodiment is applicable to simulation using observation data that are spatially discrete but the values of which are of high accuracy and observation data that are spatially continuous but the values of which are of insufficient accuracy. In the following description, a specific example in which, using a simulation device in the present invention, simulation of soil moisture content is performed will be described. In the respective drawings referenced in the second example embodiment of the present invention, the same signs are assigned to the same components and steps as those in the first example embodiment of the present invention and a detailed description thereof in the present example embodiment will be omitted.

Figure 7:
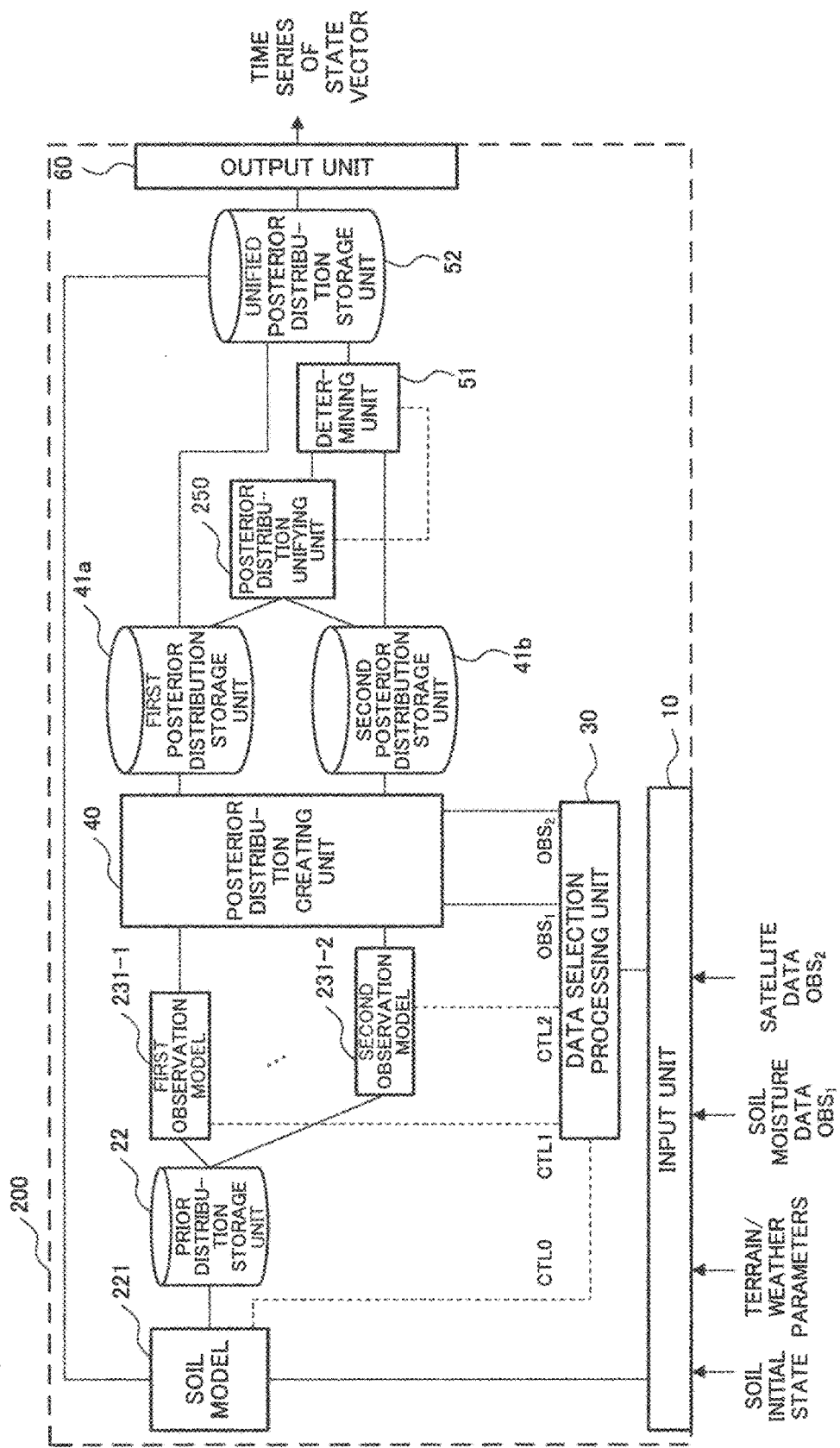
FIG. 7 is a block diagram illustrating a configuration of a simulation device as a second example embodiment of the present invention.

First, a configuration of a simulation device 200 as the second example embodiment of the present invention is illustrated in FIG. 7. In FIG. 7, the simulation device 200 has a configuration in which a soil model 221 is applied as the system model 21 in the simulation device 100 as the first example embodiment of the present invention. The simulation device 200 also has a configuration in which two observation models 231-1 and 231-2, which are related to two types of observation data, are applied as the m observation models 31 in the simulation device 100 as the first example embodiment of the present invention. The simulation device 200 differs from the simulation device 100 as the first example embodiment of the present invention in that the simulation device 200 includes a posterior distribution unifying unit 250 in place of the posterior distribution unifying unit 50.

In the present example embodiment, a soil initial state is applied as an initial state in the present invention, and terrain/weather parameters are applied as parameters in the present invention. As two (M=2) sets of observation data, two types of observation data, soil moisture data $OBS_1$ and satellite data $OBS_2$, are applied.

Figure 8:
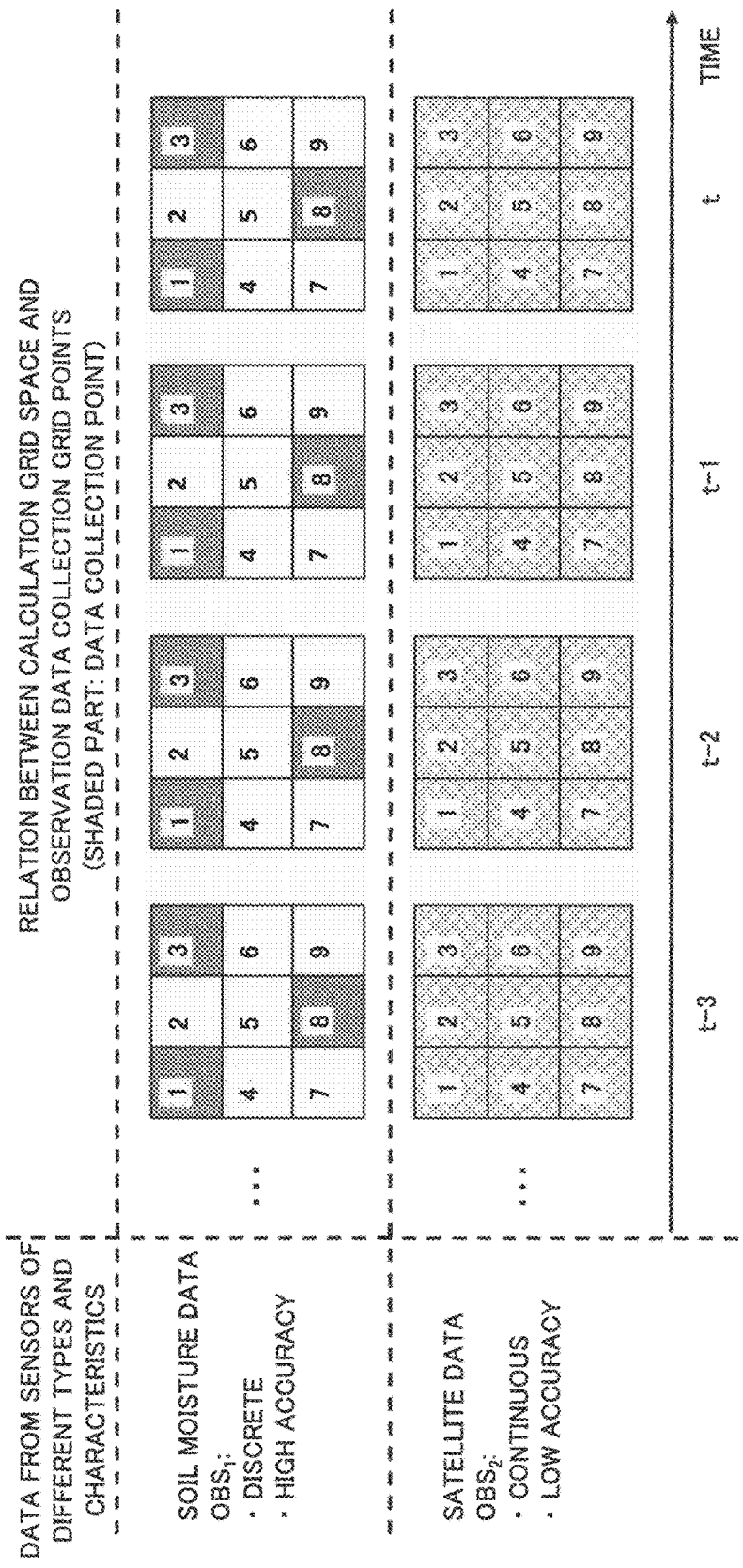
FIG. 8 is a diagram schematically illustrating a relationship between time series variations of sets of observation data and a calculation grid space in the second example embodiment of the present invention.

Here, the two types of observation data to be used in the present example embodiment, the soil moisture data $OBS_1$ and the satellite data $OBS_2$, will be described. In FIG. 8, with respect to the soil moisture data $OBS_1$ and the satellite data $OBS_2$, time series variations (at four steps t−3 to t) thereof in a calculation grid space (including nine grids 1 to 9) which is a target thereof are schematically illustrated. In FIG. 8, shaded parts indicate grid points at which observation data are collected. In the present example embodiment, the spatial range and interval of collection of the two types of observation data are assumed to be the same as those of the calculation grid space. Even if a data collection point is located locally within each grid, a value within the grid is regarded as uniform.

The soil moisture data $OBS_1$ may be, for example, observation values obtained from dielectric constant soil moisture sensors, which are buried under soil and calculate soil moisture values on the basis of dielectric constants. In addition, the soil moisture data $OBS_1$ may be observation values collected by other types of sensors. A feature of the soil moisture data $OBS_1$ is that, although observation values are discrete in space because only values at points where sensors are placed can be measured, the observation values are of high accuracy because physical quantities equivalent to soil moisture are directly measured. In FIG. 8, it is assumed that sensors are placed at only three points with grid point numbers 1, 3, and 8.

The satellite data $OBS_2$ may be, for example, remote sensing data obtained from the ASTER sensor mounted on the Terra satellite (Terra/ASTER). More specifically, data, collected by the Terra/ASTER, representing the intensity of reflected light from sunlight in the near-infrared (Band 3, 0.78-0.86 μm) and short-wavelength infrared (Band 4, 1.600-1.700 μm) wavelengths are applicable as the satellite data $OBS_2$. In addition, as the satellite data $OBS_2$, data collected by other methods or in other wavelengths may be applicable. A feature of the satellite data $OBS_2$ is that, since the intensity of reflected light off the surface of the ground from sunlight in the near-infrared and short-wavelength infrared wavelength ranges can be collected as two-dimensional image data, observation values are continuous in space. However, since the satellite data $OBS_2$ are estimated on the basis of obtained data using a statistically significant correlation between the intensity of reflected light, reflectivity, or the like in the above wavelengths and moisture content of ground surface layer soil, observation values are indirect values and, thus, there is a possibility that the accuracy thereof becomes insufficient.

Next, the soil model 221 will be described. The soil model 221 is an example of the system model 21 in the first example embodiment of the present invention. The soil model 221 calculates the space and time variation of soil moisture content and the like using, as parameters, physical properties of soil to be observed, such as degrees of slope and drainage, and weather conditions, such as precipitation. To the soil model 221, for example, an LSM (LAND-SURFACE MODEL) may be applied. To the soil model 221, a soil module of a decision support system for agriculture DSSAT (Decision Support System for Agrotechnology Transfer) and the like may also be applied.

The posterior distribution unifying unit 250, as with the first example embodiment of the present invention, calculates a new posterior distribution by unifying a first posterior distribution and a second posterior distribution into the new posterior distribution for each combination of a state variable and a grid point for which the second posterior distribution is created. In addition, in performing the unifying processing, the posterior distribution unifying unit 250 may use a model that is created on the basis of spatial correlations between respective posterior distributions having been already calculated. As the model, for example, a covariance function and a variogram function are applicable. However, the posterior distribution unifying unit in the present invention may use another model based on spatial correlations between respective posterior distributions. In this case, the posterior distribution unifying unit 250 may apply Bayesian updating to parameters, which characterize arithmetic operations in the model used for unification, on the basis of spatial correlations between respective posterior distributions having been already calculated. The processing using a model based on spatial correlations and the processing of applying Bayesian updating to the parameter thereof will be described in the following description of an operation in conjunction with a specific example.

A specific example of an operation of the simulation device 200 configured as described above will be described.

First, the soil model 221 obtains a soil initial state and terrain/weather parameters via the input unit 10 and sets soil moisture content $SM_k$ at a grid point k to a state variable (step S101 in FIG. 4 and step S201 in FIG. 5).

When it is assumed that state variables at a grid point k (k=1 to 9) illustrated in FIG. 8 include only soil moisture content $SM_k$, a state vector at a time t in soil moisture content simulation is expressed by the expression:

$$X_t = (SM_1, SM_2, \ldots, SM_9)_t^T \quad (20).$$

Here, a description will be made mainly on an example in which only soil moisture content is set as a state variable at a grid point. However, in addition to a dynamic variable varying in time and a quantity the value of which is to be estimated, a static variable is applicable as a state variable. The state variables may be chosen depending on a phenomenon subject to simulation, a system model, a purpose, and the like. The state variables may be chosen so that, as expressed by the expression (2), a state vector at a time can be created on the basis of a state vector at the previous step and the soil model 221. Since, as the number of state variables increases, calculation amount increases, the state variables are preferably set appropriately in accordance with allowable computational resources.

Next, a data selection processing unit 30 obtains two types of observation data (step S102 in FIG. 4), and, as m types of observation data to be used, selects the soil moisture data $OBS_1$ and the satellite data $OBS_2$ (step S103).

Next, the data selection processing unit 30 create two observation models including a first observation model 231-1 related to the soil moisture data $OBS_1$ and a second observation model 231-2 related to the satellite data $OBS_2$ (step S104).

A case in which the soil moisture data $OBS_1$ have the same number of dimensions as that of the state variables SM and noises in observation values follow Gaussian (normal) distributions is assumed here. It is also assumed that, as illustrated in FIG. 8, calculation grid points and observation grid points coincide with each other. In this case, the matrix expressed by the expression (7) becomes an identity matrix. Therefore, the observation data $OBS_1$ and the state variables are, according to the observation model equation expressed by the expression (8), expressed by a linear relational expression expressed by the expression:

$$OBS_1 = X + w_1 \quad (21).$$

Here, the observation noise $w_1$ may be set to be, for example, a Gaussian distribution with a mean of 0 and a variance σ1. In this way, the data selection processing unit 30 creates the first observation model 231-1 expressed by the expression (21).

It is assumed that, with regard to the satellite data $OBS_2$, the intensity of reflected light or reflectivity observed in the near-infrared and short-wavelength infrared wavelengths and soil moisture content are related with each other by means of a non-linear function $h_2$. It is, however, assumed that observation grid points coincide with the calculation grid points, as with the soil moisture data $OBS_1$. In this case, the observation data $OBS_2$ and the state variables are, according to the observation model equation expressed by the expression (8), expressed by a non-linear relational expression expressed by the expression:

$$OBS_2 = h_2(X, w_2) \quad (22).$$

Here, the observation noise $w_2$ may also be set to be, for example, a Gaussian distribution with a mean of 0 and a variance σ2. In this way, the data selection processing unit 30 creates the second observation model 231-2 expressed by the expression (22).

Next, the soil model 221, at the start point of a simulation, obtains ensembles based on the soil initial state (t=0 in the expression (20)), the terrain/weather parameters, and ensembles representing a system noise. The soil model 221 calculates prior distributions of the state vector at t=1 using the time evolution equation of each ensemble, expressed by the expression (4), and stores the calculated prior distributions in a prior distribution storage unit 22 (step S202 in FIG. 5).

Next, it is assumed that, at the time t=1, the observation data $OBS_1$ and $OBS_2$ is obtained (Yes in step S203). Thus, the observation models 231-1 and 231-2 transform the ensembles of the state vector at the time t=1, stored in the prior distribution storage unit 22, using the expressions (21) and (22) (step S204).

Next, the posterior distribution creating unit 40, for each grid point, calculates a posterior distribution using Bayes' theorem expressed by the expression (9) (step S205). However, as illustrated in FIG. 8, while two observation values $OBS_1$ and $OBS_2$ is obtained for each of grid points 1, 3, and 8, only one observation value $OBS_2$ is obtained for each of grid points 2, 4, 5, 6, 7, and 9. Therefore, for each of the former grid points 1, 3, and 8, the posterior distribution creating unit 40 calculates a first posterior distribution using all the observation data selected by the data selection processing unit 30 and the expression (23) below, which is based on the expression (13):

$$p(SM_i \mid OBS1_i, OBS2_i) = \frac{p(OBS1_i \mid SM_i)p(OBS2_i \mid SM_i)p(SM_i)}{Z}. \quad (23)$$

Here, the expression (23) holds true for i=1, 3, and 8. It is assumed that $OBS1_i$ and $OBS2_i$ denote pieces of the observation data $OBS_1$ and $OBS_2$ obtained at the grid point i, respectively. The first posterior distributions at the grid points 1, 3, and 8, which are calculated using the expression (23), are stored in a first posterior distribution storage unit 41a (Y in step S206 and step S207). The first posterior distributions at the grid points 1, 3, and 8 are also stored in a unified posterior distribution storage unit 52 (step S208).

Since, at each of the latter grid points 2, 4, 5, 6, 7, and 9, one of the types of observation data selected by the data selection processing unit 30 is missing, the posterior distribution creating unit 40 calculates a second posterior distribution using the expression (24) below, which is based on the expression (15):

$$p(SM_j \mid OBS2_j) = \frac{p(OBS2_j \mid SM_j)p(SM_j)}{Z'}. \quad (24)$$

Here, the expression (24) holds true for j=2, 4, 5, 6, 7, and 9. The second posterior distributions at the grid points 2, 4, 5, 6, 7, and 9, which have been calculated using the expression (24), are stored in a second posterior distribution storage unit 41b (N in step S206 and step S209).

Next, the posterior distribution unifying unit 250 unifies the first and second posterior distributions, which are calculated using the expressions (23) and (24) (step S300).

In the present example embodiment, as a function g for unifying posterior distributions, which is expressed by the expression (19), for example, a linear combination of posterior distributions at surrounding grid points is considered. For example, with regard to the grid point 2 illustrated in FIG. 8, since observation data include only the satellite data $OBS_2$, a second posterior distribution expressed by the expression (24) is stored in the second posterior distribution storage unit 41b. When a posterior distribution at the grid point 2 is expressed by a linear combination of posterior distributions at the grid points other than the grid point 2, the posterior distribution is expressed as:

$$p'(SM_2 \mid OBS_1, OBS_2) = \alpha_1 p(SM_1 \mid OBS_1, OBS_2) + \alpha_3 p(SM_3 \mid OBS_1, OBS_2) + \ldots + \alpha_9 p(SM_9 \mid OBS_2) \quad (25)$$

Here, $\alpha 1$ to $\alpha 9$ are weighting factors that are equivalent to a parameter set $\pi$ the expression (19). Hereinafter, the dash (') of the probability distribution p' in the expression (25) indicates that the probability distribution is a probability distribution after unification by the posterior distribution unifying unit 250. Then, the expression (25) may be considered equivalent to the so-called Kriging method, in which an unknown value at the grid point 2 is determined on the basis of a probabilistic interrelation with values at surrounding grid points, that is, a spatial correlation. The values at the grid points are, however, not definite values but posterior distributions calculated using the expressions (23) and (24). That is, when a covariance function expressing a spatial correlation between posterior distributions $p(SM \mid OBS)$ of soil moisture content at a position $r_k$ of a grid point k and a position $r_k+\gamma$ of a grid point separated from the grid point k by a distance $\gamma$.

$$C(\gamma) = C\{p(SM(r_k) \mid OBS), p(SM(r_k+\gamma) \mid OBS)\} \quad (26)$$

is obtained, the weighting factors $\alpha 1$ to $\alpha 9$ in the expression (25), that is, the parameter set $\pi$, is also obtained. In the expression (26), SM(x) denotes a state variable SM at a grid point located at a position x. In addition, OBS denotes m types of observation data. The parameter set can be obtained by solving a simple Kriging equation system as expressed by, for example, the expression (27) below. In the present invention, the method for obtaining the parameters $\pi$ in the function g, which the posterior distribution unifying unit uses in unifying posterior distributions, is not limited to the above-described method, and may be another method.

$$\begin{pmatrix} C(0) & C(r_1-r_3) & \ldots & C(r_1-r_9) \\ C(r_3-r_1) & C(0) & \ldots & C(r_3-R_9) \\ \vdots & \vdots & \ddots & \vdots \\ C(r_9-r_1) & C(r_9-r_3) & \ldots & C(0) \end{pmatrix} \begin{pmatrix} \alpha_1 \\ \alpha_3 \\ \vdots \\ \alpha_9 \end{pmatrix} = \begin{pmatrix} C(r_1-r_2) \\ C(r_3-r_2) \\ \vdots \\ C(r_9-r_2) \end{pmatrix} \quad (27)$$

Figure 9:
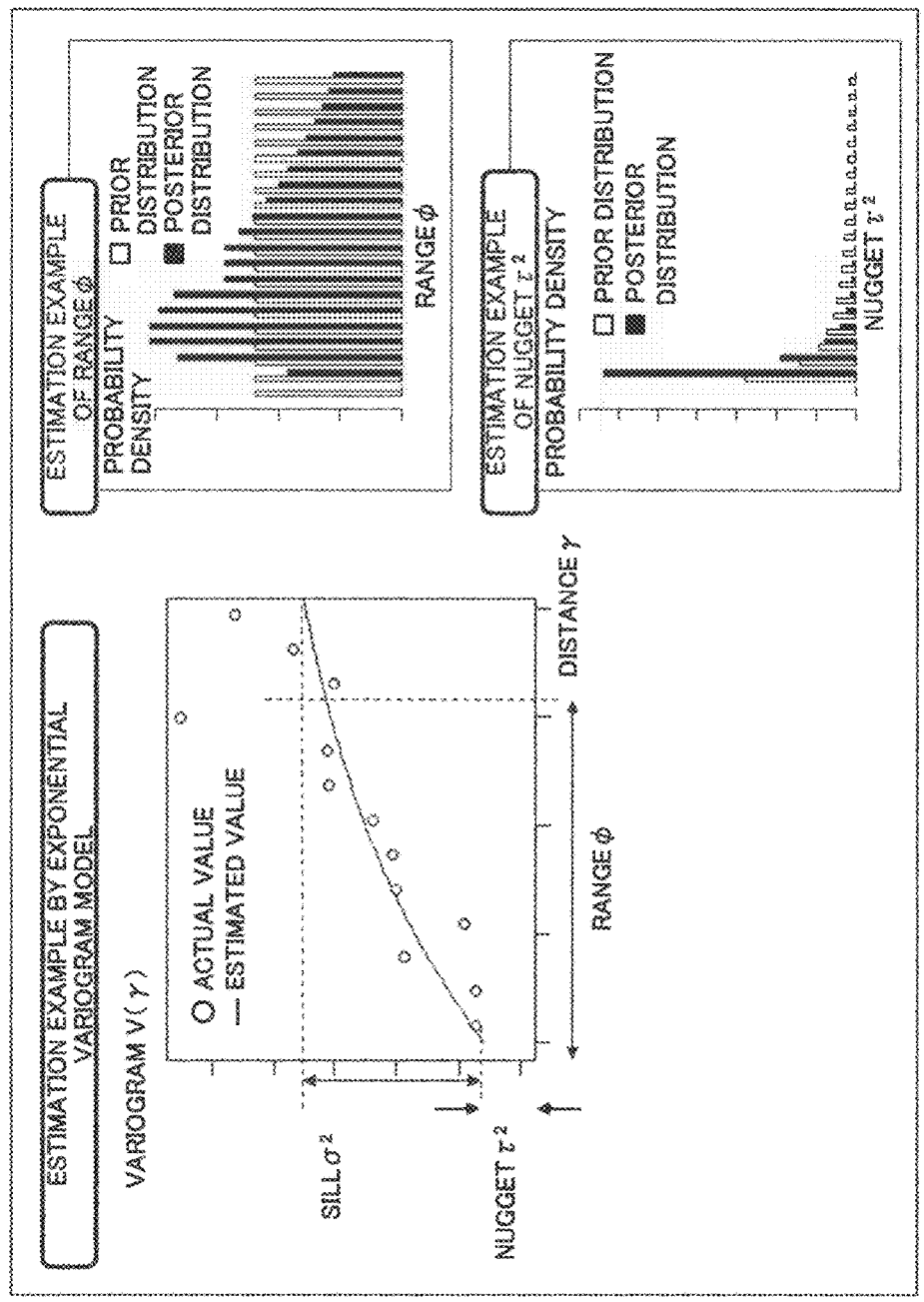
FIG. 9 is a diagram illustrating an example of a variogram estimation result in posterior distribution unification performed by the simulation device as the second example embodiment of the present invention.

Next, an operation of obtaining a covariance function expressed by the expression (26) will be described. Since, between a covariance function $C(\gamma)$ and a variogram function $V(\gamma)$, a simple relation:

$$V(\gamma) = C(0) - C(\gamma) \quad (28)$$

holds, it may be good to obtain either of the functions. In the following description, a case of, in the posterior distribution unifying unit 250, obtaining a variogram function $V(\gamma)$ first will be described. A variogram, as with a covariance function, represents a probabilistic interaction, that is, a spatial correlation between a position $r_k$ of a grid point k and a position $r_k+\gamma$ of a grid point separated from the grid point k by a distance $\gamma$. On the left side of FIG. 9, an example of a variogram estimation result is illustrated. In the example, to results from calculation of variograms at grid points other than a grid point at which unification calculation is to be performed, an exponential variogram model:

$$V(\gamma,\xi) = \tau^2 + \sigma^2(1-\exp(-\phi\|\gamma\|^2))$$

$$\xi = (\tau_2, \sigma^2, \phi) \quad (29)$$

is fit, and parameters $\xi$ thereof are estimated. In the expression (29), $\xi$ denotes a set of three types of parameters characterizing a variogram, which are generally referred to as a nugget $\tau^2$, a range $\phi$, and a sill $\sigma^2$. In the example, a result from an estimation performed, according to Bayes' theorem expressed by the expression (9), with respect to a range $\phi$ and a nugget $\tau^2$, among the parameters, is illustrated. Specifically, assuming a uniform prior distribution for the range $\phi$ and an exponential prior distribution for the nugget $\tau^2$ because of values close to 0 being expected for the nugget $\tau^2$, posterior distributions of the respective parameters were obtained on the basis of actually calculated variograms according to Bayes' theorem. Examples of obtained results are illustrated on the right side of FIG. 9. As is evident from the drawing, the posterior distributions have maximum values, which may be considered to be values of the parameters that reproduces calculated variograms best, that is, maximum likelihood values. The curve (estimated values) on the left side of FIG. 9 is drawn according to the expression (29) under the parameters. Since a function representing the variogram $V(\gamma)$ can be calculated as described above, the covariance function can also be calculated using the expression (28). Although a parameter estimation method according to Bayes' theorem is described in the example, the method is only an example and another method may be used. FIG. 9 illustrates only an example of estimation results and does not illustrate estimation results relating to the grid space (grids 1 to 9) illustrated in FIG. 8.

Therefore, since the covariance function $C(\gamma)$ expressed by the expression (26) is calculated, the simple Kriging equation system expressed by the expression (27), for example, can be solved. Since, by that, the coefficients in the expression (25) expressing unification of posterior distributions, that is, the parameter set $\pi$, is calculated, the posterior distribution unifying unit 250 is able to obtain the unified posterior distribution p'($SM_2$|$OBS_1$, $OBS_2$) at the grid point 2. The posterior distribution unifying unit 250 also obtains a unified posterior distribution p'($SM_k$|$OBS_1$, $OBS_2$) with respect to another grid point k at which a second posterior distribution is created in the same manner.

Figure 10:
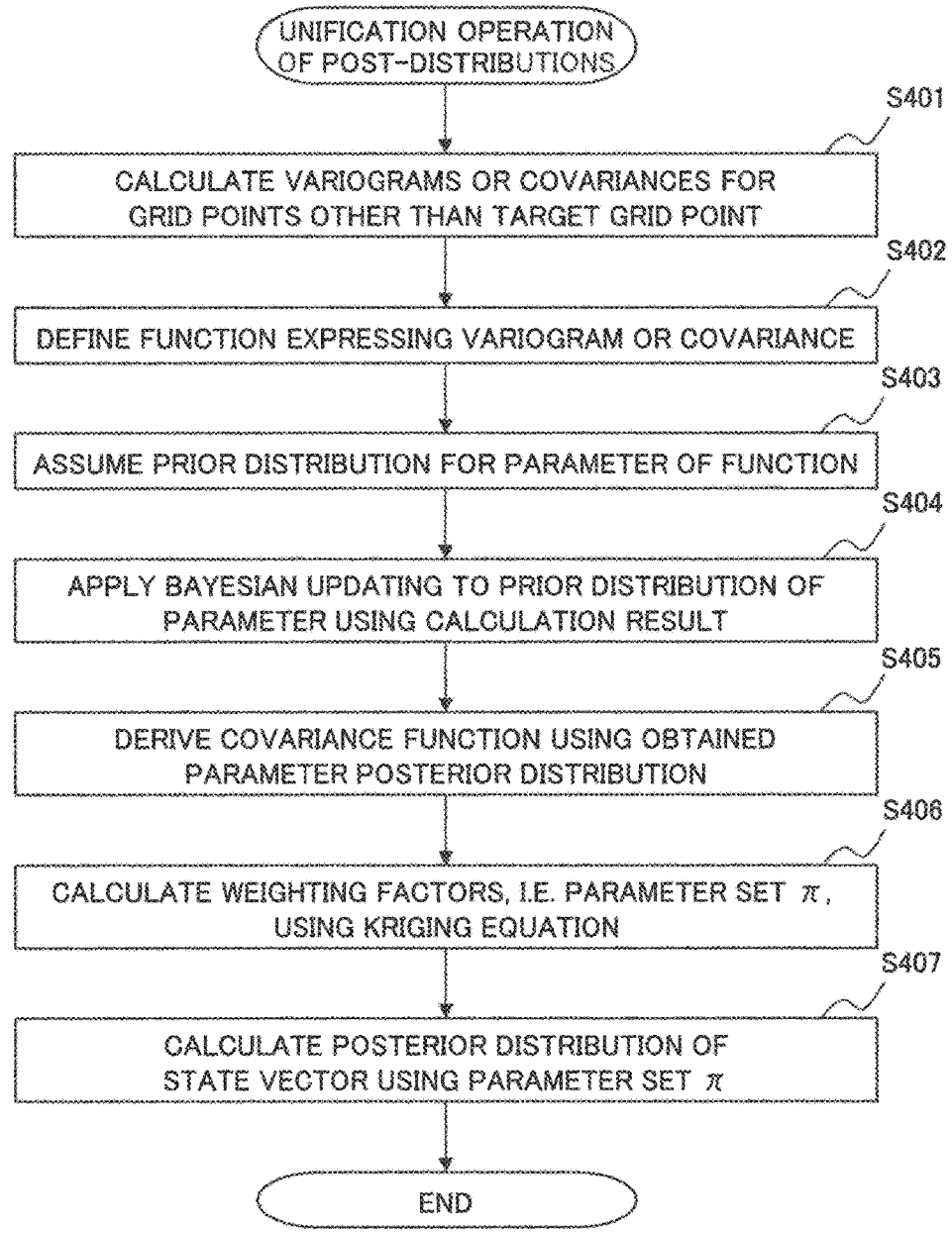
FIG. 10 is a flowchart describing a posterior distribution unification operation performed by the simulation device as the second example embodiment of the present invention.

Here, details of the unification operation performed by the posterior distribution unifying unit 250 in step S300 are illustrated in FIG. 10. In FIG. 10, a unification operation for a grid point, as a target, at which a second posterior distribution is calculated is illustrated.

In FIG. 10, the posterior distribution unifying unit 250 first calculates variograms or covariances with respect to grid points other than a target grid point (step S401).

Next, the posterior distribution unifying unit 250 defines a function that may fit to the variograms or covariances calculated in step S401 (step S402).

Next, the posterior distribution unifying unit 250 assumes prior distributions for parameters of the function defined in step S402 (step S403).

Next, the posterior distribution unifying unit 250 obtains posterior distributions of the parameters by updating the prior distributions, assumed in step S403, of the parameters on the basis of the calculated variograms or covariances by use of Bayes' theorem (step S404).

Next, the posterior distribution unifying unit 250 derives a covariance function using the posterior distributions of the parameters obtained in step S404 (step S405).

Next, the posterior distribution unifying unit 250, using a Kriging equation, obtains weighting factors (parameter set $\pi$) used in unifying posterior distributions at grid points other than the target grid point (step S406).

Next, the posterior distribution unifying unit 250, using the parameter set $\pi$ obtained in step S406, unifies posterior distributions at grid points other than the target grid point (step S407).

In this way, in step S300 in FIG. 5, a unified posterior distribution is calculated.

Subsequently, the simulation device 200 performs steps S301 to S304 and S208 in the same manner as in the first example embodiment of the present invention. By this, with respect to each grid point at which a second posterior distribution is created, a unified posterior distribution or the second posterior distribution is stored in the unified posterior distribution storage unit 52. The soil model 221, using the state vector generated from posterior distributions at the time step, which are stored in the unified posterior distribution storage unit 52, continues calculation for the next time step.

Next, an advantageous effect of the second example embodiment of the present invention will be described.

The simulation device as the second example embodiment of the present invention may perform a high-resolution and high-accuracy simulation over a wide range taking into consideration non-ideal observation data and observation data that have a discontinuity or peculiarity.

The reasons for the above advantageous effect will be described. That is because the present example embodiment includes the following configuration in addition to the same configuration as that of the first example embodiment of the present invention. That is, that is because the posterior distribution unifying unit, in unifying a first posterior distribution and a second posterior distribution with respect to each grid point at which the second posterior distribution is created, uses a model that is created on the basis of spatial correlations between calculated posterior distributions. That is also because the posterior distribution unifying unit applies Bayesian updating to parameters characterizing arithmetic operations in the model used in the unification on the basis of spatial correlations between calculated posterior distributions.

Accordingly, even when observation data that, when used alone, include only an insufficient number of pieces of data or have a distribution that is biased spatially are provided, by using such observation data in plural varieties, the present example embodiment may unify posterior distributions at grid points with higher accuracy. As a result, the present example embodiment enables a high-resolution and high-accuracy simulation to be performed over a wider range.

In the second example embodiment of the present invention, an example in which a soil model is applied as the system model, soil sensor data and satellite data are applied as a plurality of sets of observation data, and simulation of soil moisture content is performed is described. In addition thereto, the present example embodiment may be embodied for another object using another system model and observation data. For example, the present example embodiment may be embodied by applying a weather model as the system model and weather sensor data and satellite data as a plurality of sets of observation data.

(Third Example Embodiment)

Next, a third example embodiment of the present invention will be described with reference to the drawings. The present example embodiment may be applied to simulation in the case in which observation grid intervals of a plurality of sets of observation data differ from one another and simulation in the case in which collection time intervals thereof differ from one another. In the following description, a specific example in which simulation of crop growth is performed using a simulation device of the present invention will be described. In the drawings referenced in the third example embodiment of the present invention, the same signs are assigned to the same components and steps as those in the first example embodiment of the present invention and a detailed description thereof in the present example embodiment will be omitted.

Figure 11:
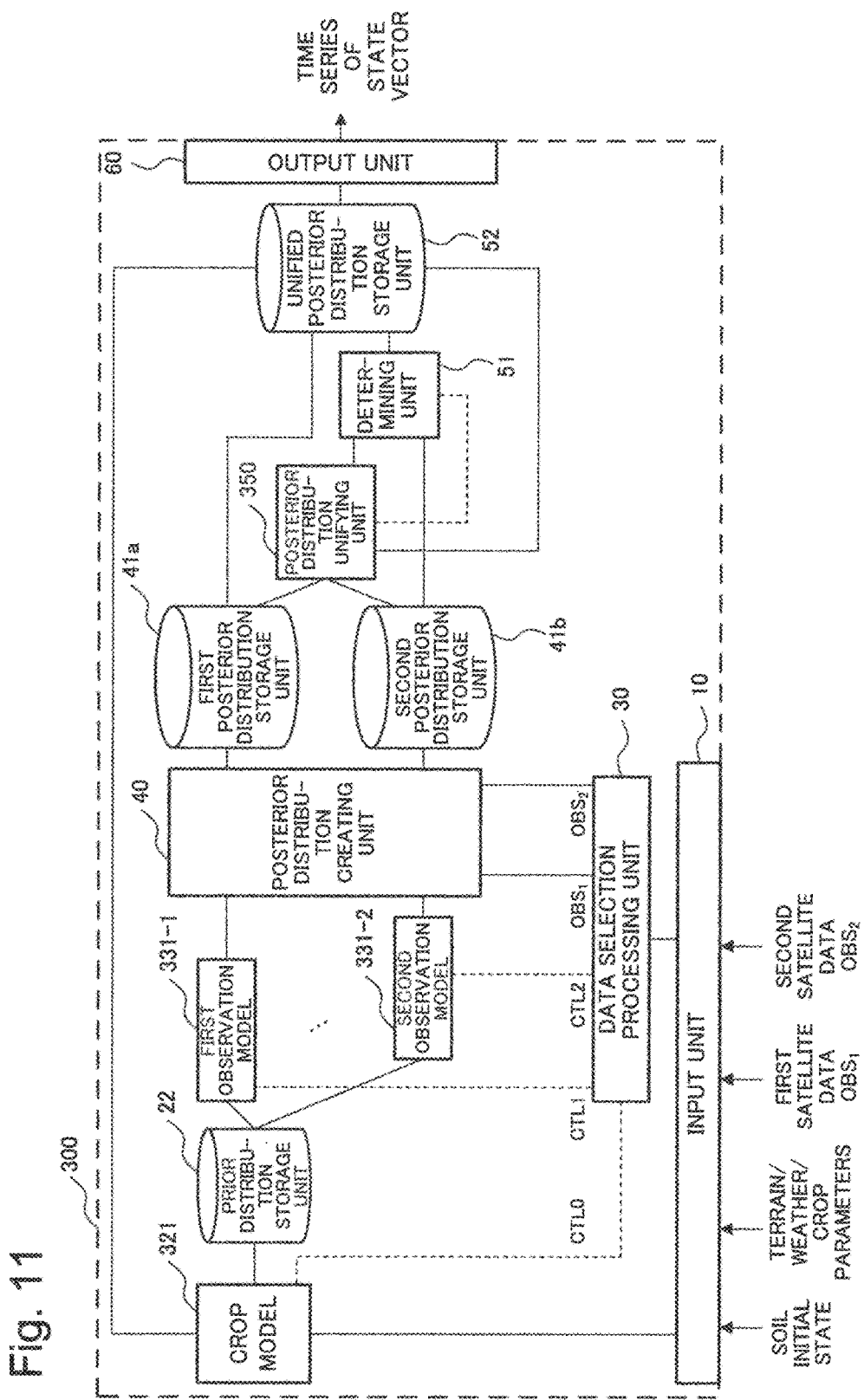
FIG. 11 is a block diagram illustrating a configuration of a simulation device as a third example embodiment of the present invention.

First, a configuration of a simulation device 300 as the third example embodiment of the present invention is illustrated in FIG. 11. In FIG. 11, the simulation device 300 has a configuration in which a crop model 321 is applied as the system model 21 in the simulation device 100 as the first example embodiment of the present invention. The simulation device 300 also has a configuration in which two observation models 331-1 and 331-2, which related to two types of observation data, are applied as the m observation models 31 in the simulation device 100 as the first example embodiment of the present invention. The simulation device 300 differs from the simulation device 100 as the first example embodiment of the present invention in that the simulation device 300 includes a posterior distribution unifying unit 350 in place of the posterior distribution unifying unit 50.

In the present example embodiment, a soil initial state is applied as an initial state in the present invention, and terrain/weather/crop parameters are applied as parameters in the present invention. As two (M=2) sets of observation data, two types of satellite data (remote sensing data) are applied.

Two types of observation data to be used in the present example embodiment, satellite data $OBS_1$ and satellite data $OBS_2$, will now be described.

Figure 12:
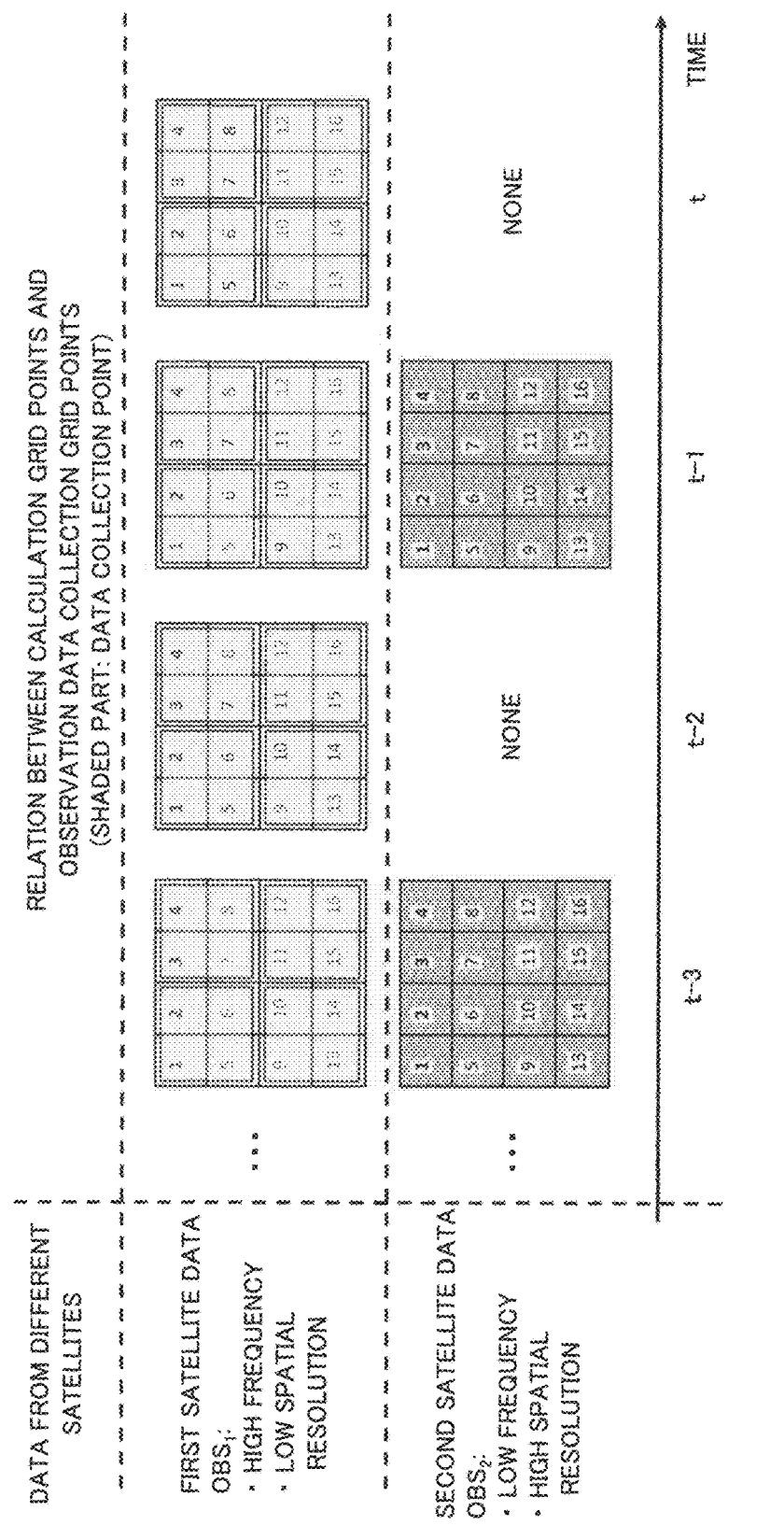
FIG. 12 is a diagram schematically illustrating a relationship between time series variations of sets of observation data and a calculation grid space in the third example embodiment of the present invention.

As illustrated in FIG. 12, in the present example embodiment, the first satellite data are collected at a high frequency and have a low spatial resolution, and the second satellite data are collected at a low frequency and have a high spatial resolution. In FIG. 12, with respect to the first satellite data $OBS_1$ and second satellite data $OBS_2$, time series variations (at four steps t−3 to t) thereof in a calculation grid space (including sixteen grids 1 to 16) as a target are schematically illustrated. In FIG. 12, shaded parts indicate grid points at which observation data are collected.

The first satellite data, which are collected at a high frequency and have a low spatial resolution, may be data obtained from, for example, a MODIS sensor mounted on the Terra satellite or the AQUA satellite (Terra-AQUA/MODIS). More specifically, data, collected by the Terra-AQUA/MODIS, representing the intensity of reflected light from sunlight in the visible red band (wavelength of 0.58-0.86 μm) and near-infrared band (wavelength of 0.725-1.100 μm) are applicable as the first satellite data. The first satellite data as described above can, although depending on the latitude of a region where data are collected, be collected every day basically. However, the first satellite data as described above have a ground level spatial resolution of as low as approximately 250 m.

Observation data that are usable as the second satellite data, which are collected at a low frequency and have a high spatial resolution, include observation data obtained from, for example, a LANDSAT satellite, a PLEIADES satellite, the ASNARO satellite, or the like. The wavelength range of satellite data collected by the above-described satellites is approximately the same as the wavelength of data collected as the first satellite data. The collection frequency and ground level resolution of the second satellite data as described above are, in the case of a LANDSAT satellite, every 8 to 16 days and approximately 30 m, and, in the case of a PLEIADES satellite and the ASNARO satellite, every 2 to 3 days and approximately 2 m.

The Normalized Difference Vegetation Index (NDVI), which is generally used as a vegetation index that indicates the growth state of a crop, can be calculated from reflectivity values in the afore-described two bands (the visible red band and the near-infrared band). The wavelength range of data collected as observation data is, however, not necessarily limited to the above bands. In the present example embodiment, the crop model 321 calculates the Leaf Area Index (LAI) as a quantity representing the growth state of a crop. The LAI is known to have a correlation with the vegetation index NDVI. The LAI as described above is calculated upon inputting data of a soil initial state and terrain/weather/crop parameters set to the crop model 321.

One of the differences between the present example embodiment and the other afore-described example embodiments of the present invention is that the grid intervals of the two types of observation data $OBS_1$ and $OBS_2$ differ from each other. Thus, the calculation grids of the crop model 321 are set in such a way as to coincide with the grids of at least either one of the observation data $OBS_1$ and $OBS_2$. With regard to the other observation data, a vector in an observation model equation expressed by the expression (7) may be changed so as to have, for example, weighted averages of values at neighboring grid points as elements thereof. Another difference between the present example embodiment and the other afore-described example embodiments of the present invention is that the collection time intervals of the two types of observation data $OBS_1$ and $OBS_2$ differ from each other. Thus, the posterior distribution unifying unit 350, by estimating posterior distributions obtained from the observation data $OBS_2$, which are collected at a low frequency, on the basis of temporal correlations, unifies the posterior distributions obtained from the observation data $OBS_2$ with posterior distributions obtained from the observation data $OBS_1$, which are collected at a high frequency, in synchronization with collection times of the posterior distributions obtained from the observation data $OBS_1$.

Using an example of two types of observation data $OBS_1$ and $OBS_2$ illustrated in FIG. 12, an operation of the simulation device 300 will be specifically described below.

First, the crop model 321 sets leaf area indices $LAI_k$ as state variables at grid points k (k=1 to 16) illustrated in FIG. 12 (step S101 in FIG. 4). A state variable to be set at a grid point may be chosen in accordance with the dependency of the variable on time and the number of unknown quantities to be estimated.

Next, a data selection processing unit 30 obtains the two types of observation data (step S102), and selects the first satellite data $OBS_1$ and the second satellite data $OBS_2$ as m types of observation data to be used (step S103).

Next, the data selection processing unit 30 creates two observation models, a first observation model 331-1 related to the first satellite data $OBS_1$ and a second observation model 331-2 related to the second satellite data $OBS_2$ (step S104).

Referring to FIG. 12, with regard to the first observation data $OBS_1$, a value at an observation data collection grid point (a shaded part in the drawing) can be associated with the average of values at four calculation grid points overlapped by the observation data collection grid point. Therefore, the observation model 331-1 is, using relations between the first observation data $OBS_1$ at four observation grid points and the state variables $LAI_k$ (k=1 to 16), expressed by the expression:

$$OBS_1 = \begin{pmatrix} \frac{1}{4} & \frac{1}{4} & 0 & 0 & \frac{1}{4} & \frac{1}{4} & 0 & \cdots & 0 \\ 0 & 0 & \frac{1}{4} & \frac{1}{4} & 0 & 0 & \frac{1}{4} & \cdots & 0 \\ 0 & 0 & 0 & 0 & 0 & 0 & 0 & \cdots & 0 \\ 0 & 0 & 0 & 0 & 0 & 0 & 0 & \cdots & \frac{1}{4} \end{pmatrix} \begin{pmatrix} LAI_1 \\ LAI_2 \\ LAI_3 \\ LAI_4 \\ LAI_5 \\ LAI_6 \\ \vdots \\ LAI_{16} \end{pmatrix} + w_1 \equiv H_1 X + w_1. \quad (30)$$

Since grid points at which the second observation data $OBS_2$ are collected correspond to the calculation grid points in a one-to-one manner, the observation model 331-2 is, using an identity matrix, expressed by the expression:

$$OBS_2 = h \begin{pmatrix} 1 & 0 & 0 & \cdots & 0 \\ 0 & 1 & 0 & \cdots & 0 \\ 0 & 0 & 1 & \cdots & 0 \\ \vdots & & & \ddots & \vdots \\ 0 & 0 & 0 & 0 & 1 \end{pmatrix} \begin{pmatrix} LAI_1 \\ LAI_2 \\ LAI_3 \\ \vdots \\ LAI_{16} \end{pmatrix} + w_2 \equiv H_2 X + w_2. \quad (31)$$

Here, $H_1$ and $H_2$ are mappings that include a mapping h that associates their respective sets of observation data with the state variables LAI and matrices that associate sets of grid points with each other. In addition, $w_1$ and $w_2$ are observation noises and may be set to, for example, a Gaussian distribution with a mean of 0 and a variance σ and the like. The observation models 331-1 and 331-2 expressed by the expressions (30) and (31) are specific examples of the observation model equation expressed by the expression (8).

Next, the crop model 321 obtains a soil initial state and terrain/weather/crop parameters and calculates prior distributions of the state vector at the next step in the simulation (steps S201 and S202 in FIG. 5). The observation models 331-1 and 331-2, using the expressions (30) and (31), transform the prior distributions (step S203). Here, it is assumed that, in step S203 after the operation illustrated in FIG. 5 has been repeated appropriately, transformed prior distributions $p(LAI_k)$ at a time t−1 in FIG. 12 have been calculated.

Next, a posterior distribution creating unit 40 creates a posterior distribution of the state variable $LAI_k$ at each grid point k (k=1 to 16) at the time t−1 in FIG. 12. Since, at the time t−1, both the observation data $OBS_1$ and $OBS_2$ are obtained, the posterior distribution creating unit 40 calculates, as a first posterior distribution:

$$p(LAI_k \mid OBS_{12})_{t-1} = \frac{LH(OBS_1 - H_1(LAI_k))LH(OBS_2 - H_2(LAI_k))p(LAI_k)}{Z}, \quad (32)$$

and stores the calculated first posterior distribution in a first posterior distribution storage unit 41a (step S205, Yes in step S206, and step S207). In the expression (32), LH is a function that calculates a likelihood expressed by the expression (13), and Z in the denominator is a normalization constant.

A case in which transformed prior distributions $p(LAI_k)$ at a time t in FIG. 12 are calculated in step S203 will also be described. In this case, since, at the time t, the second observation data $OBS_2$ are missing, the posterior distribution creating unit 40 calculates, as a second posterior distribution:

$$p(LAI_k \mid OBS_1)_t = \frac{LA(OBS_1 - H_1(LAI_k))p(LAI_k)}{Z}, \quad (33)$$

and stores the calculated second posterior distribution in a second posterior distribution storage unit 41b (step S205, No in step S206, and step S209).

Next, the posterior distribution unifying unit 350 unifies the first posterior distribution expressed by the expression (32) and the second posterior distribution expressed by the expression (33). Specifically, in the present example embodiment, as a function g for unifying posterior distributions, which is expressed by the expression (19), a linear combination of a second posterior distribution at a present time and a posterior distribution estimated from a first posterior distribution at a different time on the basis of a temporal correlation is applied. For example, with regard to a posterior distribution at the time t in FIG. 12, since, as described above, observation data include only the first satellite data $OBS_1$, a second posterior distribution expressed by the expression (33) is stored in the second posterior distribution storage unit 41b. Thus, the posterior distribution unifying unit 350 estimates and creates a first posterior distribution at the time t to be unified with the second posterior distribution at the time t from a posterior distribution having been created at a past time before the time t on the basis of a temporal correlation. A first posterior distribution at the time t estimated from posterior distributions at times t=1 to t−1 is denoted by $p(LAI_k|OBS_1, OBS_2)_{1:t-1}$. The posterior distribution unifying unit 350 unifies a second posterior distribution $p(LAI_k|OBS_1)_t$ at the time t and the first posterior distribution $p(LAI_k|OBS_1, OBS_2)_{1:t-1}$ at the time t, which is estimated on the basis of a temporal correlation, by the expression (34) below:

$$p'(LAI_k|OBS_1, OBS_2)_t = \alpha_0 p(LAI_k|OBS_1)_t + \beta_0 p(LAI_k|OBS_1,OBS_2)_{1:t-1} \quad (34).$$

In the expression (34), $\alpha_0$ and $\beta_0$ are weighting factors that are equivalent to the parameter set π in the expression (19). In the expression (34), the dash (') of the probability distribution p' indicates that the probability distribution is a probability distribution after unification by the posterior distribution unifying unit 350.

A specific example of the processing of estimating a posterior distribution $p(LAI_k|OBS_1, OBS_2)_{1:t-1}$ at a time t from posterior distributions at times (t−1, t−2, t−3, . . . ) before the time t based on a temporal correlations will now be described. In general, as a method for estimating a value at a time t from values at times (t−1, t−2, t−3, . . . ) before the time t, a so-called autoregressive (AR) model:

$$p(LAI_k|OBS_1,OBS_2)_{1:t-1} = f_{AR}(p(LAI_k|OBS_1, OBS_2)_{t-1}, p(LAI_k|OBS_1,OBS_2)_{t-2}, \ldots) \quad (35)$$

is applicable. Here, a case in which an AR model $f_{AR}$ is expressed in a linear form is considered as an example. It is assumed that a time at which both the first satellite data $OBS_1$ and the second satellite data $OBS_2$ have been observed and a first posterior distribution has been created and that is a time before a time t is denoted by t−i (i=1 and 3 in FIG. 12). The expression (35) in the case of performing estimation based on only a first posterior distribution at such a time t−i is specifically expressed by the expression:

$$p(LAI_k \mid OBS_1, OBS_2)_{1:t-1} = \beta_{t-1} p(LAI_k \mid OBS_1, OBS_2)_{t-1} + \quad (36)$$
$$\beta_{t-3} p(LAI_k \mid OBS_1, OBS_2)_{t-3} + \ldots$$
$$= \sum_{i=1} \beta_{t-i} p(LAI_k \mid OBS_1, OBS_2)_{t-i}.$$

A case in which a posterior distribution at a time at which no second observation data $OBS_2$ is obtained and a second posterior distribution is created (in FIG. 12, t−2, t−4, . . . ) is also taken into consideration is considered. In this case, using a unified posterior distribution stored in a unified posterior distribution storage unit 52 with respect to a time prior to the time t, the expression (35) is specifically expressed by the expression:

$$p(LAI_k \mid OBS_1, OBS_2)_{1:t-1} = \beta_{t-1} p(LAI_k \mid OBS_1, OBS_2)_{t-1} + \quad (37)$$
$$\beta_{t-2} p'(LAI_k \mid OBS_1, OBS_2)_{t-2} + \ldots$$
$$= \sum_{i=1, i \neq j} \beta_{t-i} p(LAI_k \mid OBS_1, OBS_2)_{t-i} +$$
$$\sum_{j=1, j \neq i} \beta_{t-i} p'(LAI_k \mid OBS_1, OBS_2)_{t-j}.$$

In the expression (37), the time t−i indicates a time at which a first posterior distribution is calculated, and the time t−j indicates a time at which a second posterior distribution is calculated. In the case of FIG. 12, i=1 and 3 and j=2, and i≠j holds. In the present example embodiment, a case in which a unified posterior distribution stored in the unified posterior distribution storage unit 52 is used in the expression (37) is assumed. Therefore, in FIG. 11, data paths through which information on a unified posterior distribution is transmitted from the unified posterior distribution storage unit 52 to the posterior distribution unifying unit 350 are indicated by arrows.

Using the posterior distribution $p(LAI_k \mid OBS_1, OBS_2)_{1:t-1}$ at the time t estimated in this way, the posterior distribution unifying unit 350 performs unification using the expression (34) (step S300).

Subsequently, the simulation device 300 executes steps S301 to S304 and S208 as with the first example embodiment of the present invention. By this, the unified posterior distribution or the second posterior distribution is stored in the unified posterior distribution storage unit 52 with respect to each grid point at a time t at which the second posterior distribution is created at the grid point. Using the state vector, which is generated from posterior distributions at a time t stored in the unified posterior distribution storage unit 52, the crop model 321 continues calculation for the next time step.

When a predefined time is reached, the simulation device 300 finishes the operation.

Next, an advantageous effect of the third example embodiment of the present invention will be described.

The simulation device as the third example embodiment of the present invention may perform a high-resolution and high-accuracy simulation over a wide range taking into consideration non-ideal observation data and observation data that have a discontinuity or peculiarity.

The reasons for the above advantageous effect will be described. That is because the present example embodiment includes the following configuration in addition to the same configuration as that of the first example embodiment of the present invention. In other words, that is because the posterior distribution unifying unit, in unifying a posterior distribution with respect to each grid point at which a second posterior distribution is created, uses a model that is created on the basis of temporal correlations among posterior distributions having been already calculated in the past.

As described above, the present example embodiment estimates, from posterior distributions having been already calculated in the past prior to a time t at which second posterior distributions are created, posterior distributions at the time t on the basis of temporal correlations, and, using the estimated posterior distributions, calculates unified posterior distributions at the time t. With this processing, the present example embodiment enables a plurality of sets of observation data that are collected at different frequencies to be unified in synchronization with collection timings of observation data that are observed at a higher frequency. That is, in the present example embodiment, prior distributions at a time t (simulation results) are revised to more probable unified posterior distributions at a shorter interval. As a result, the present example embodiment may reduce errors in estimating values after a next time step.

Although, in the present example embodiment, an example in which a crop model is applied as the system model and satellite data are applied as all of a plurality of sets of observation data is described, the present example embodiment does not limit the system model and the types and contents of observation data. For example, in the present example embodiment, a water dynamics and fluid model may be applied as a system model, and water level sensor data and satellite data of a river may be applied as observation data. As described above, the present example embodiment may be applied to a combination of observation data that are collected at a high frequency but are locally discrete and observation data that are collected at a low frequency but have a high resolution and are widespread, using a system model corresponding thereto appropriately.

(Fourth Example Embodiment)

Next, a fourth example embodiment of the present invention will be described with reference to the drawings. In the present example embodiment, a specific example in which, using a simulation device of the present invention, simulation of precipitation is performed will be described. The fourth example embodiment of the present invention is an example embodiment in which the calculation grid space in the second example embodiment of the present invention is expanded into a three-dimensional space. In the drawings referenced in the fourth example embodiment of the present invention, the same signs are assigned to the same components and steps as those in the second example embodiment of the present invention and a detailed description thereof in the present example embodiment will be omitted.

Figure 13:
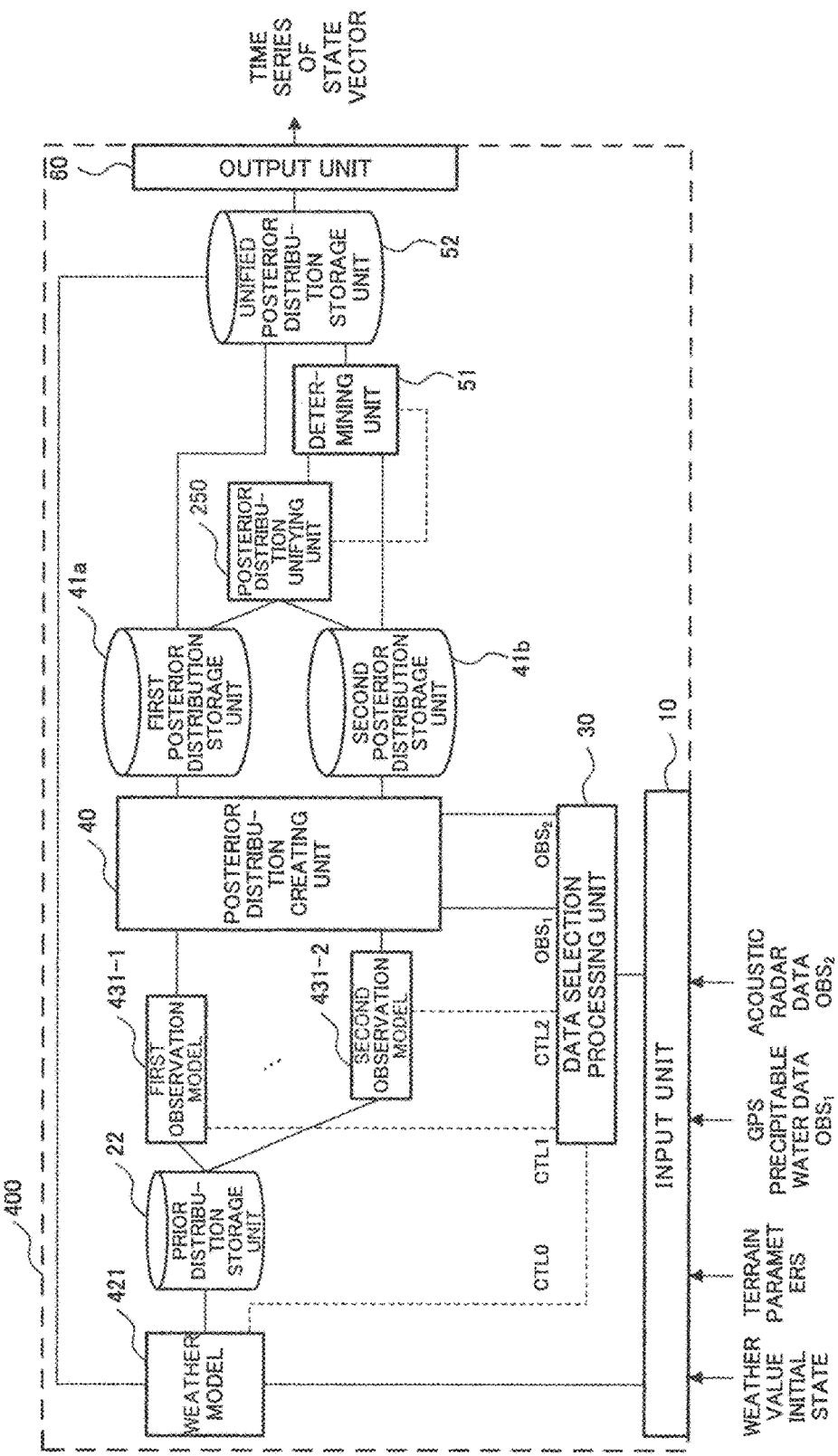
FIG. 13 is a block diagram illustrating a configuration of a simulation device as a fourth example embodiment of the present invention.

First, a configuration of a simulation device 400 as the fourth example embodiment of the present invention is illustrated in FIG. 13. In FIG. 13, the simulation device 400 has a configuration in which a weather model 421 is applied in place of the soil model 221 in the simulation device 200 as the second example embodiment of the present invention. The simulation device 400 also has a configuration in which two observation models 431-1 and 431-2 are applied in place of the two observation models 231-1 and 231-2 in the simulation device 200 as the second example embodiment of the present invention. In the present example embodiment, a weather value initial state is applied as an initial state in the present invention, and terrain parameters are applied as parameters in the present invention. As two (M=2) sets of observation data, GPS precipitable water data $OBS_1$ and acoustic radar data $OBS_2$ are applied.

Here, two types of observation data, the GPS precipitable water data $OBS_1$ and acoustic radar data $OBS_2$, which are assumed to be used in the present example embodiment will be described. GPS precipitable water is data obtained by estimating a vertically integrated water vapor content in the atmosphere, on the basis of a characteristic that, as water vapor in the atmosphere on a path until a radio wave radiated from a GPS (Global Positioning System) satellite reaches a GPS receiver increases, arrival time is delayed longer. GPS precipitable water has contributed to an improvement in the accuracy of estimation of a timing at which local heavy rain occurs and estimation of a total amount of rainfall in a round of rainfall. GPS precipitable water has a characteristic that, since, on the ground side, it is only required to arrange GPS receivers, densification is relatively easily achieved in the land surface. In contrast, with respect to the vertical direction, since GPS precipitable water is only an integrated amount in the vertical direction, it is difficult to express spatial distribution properly by means of GPS precipitable water. On the other hand, using acoustic radar enables the altitudinal dependency of water vapor content to be measured. For example, when a sound wave is emitted upward in the vertical direction and a scattering echo due to turbulence in the atmosphere is received, the echo depends on the altitudinal gradient of atmospheric refractivity. Moreover, the altitudinal gradient of atmospheric refractivity depends strongly on the altitudinal gradient of water vapor content. Therefore, observing the echo enables the altitudinal dependency of water vapor content to be measured.

Figure 14:
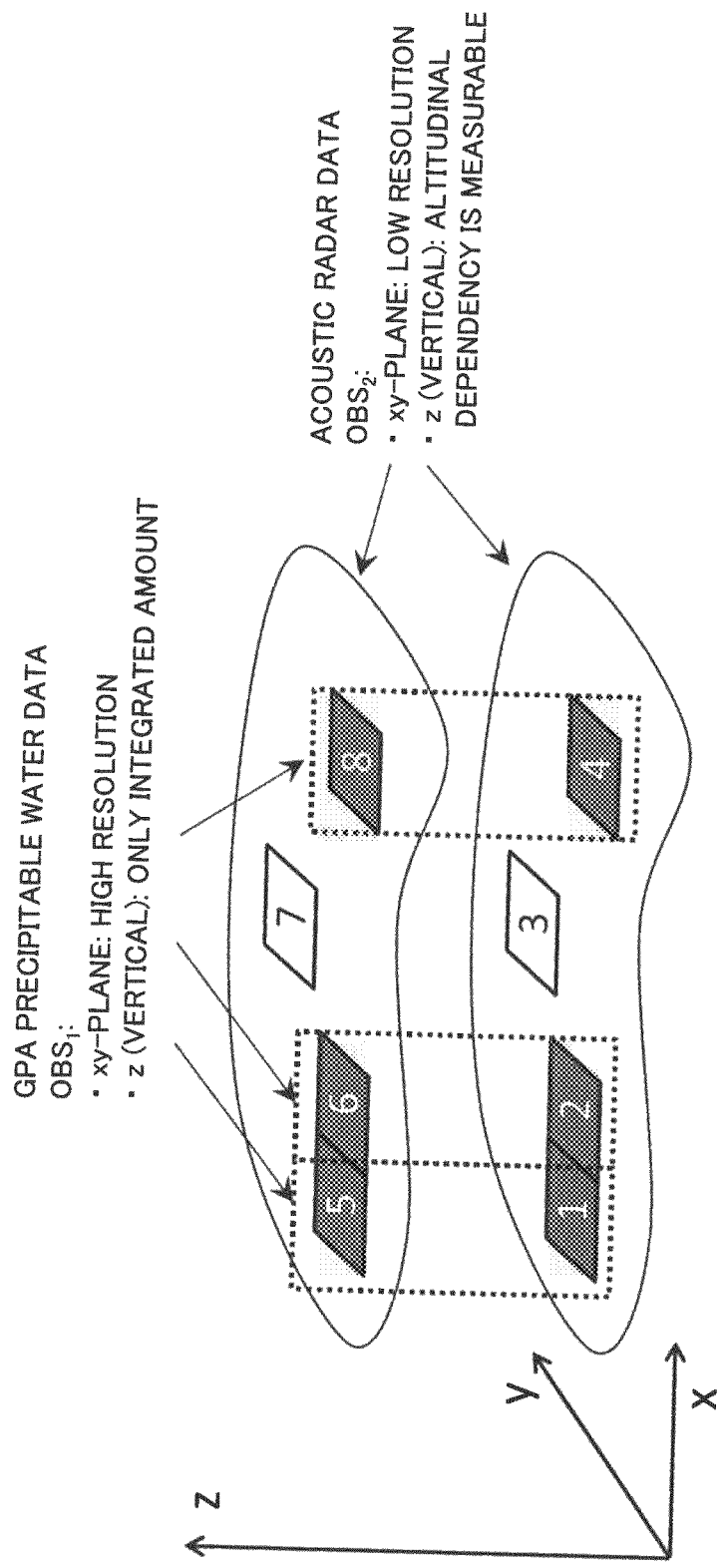
FIG. 14 is a diagram schematically illustrating a relationship between sets of observation data and a calculation grid space in the fourth example embodiment of the present invention.

The observation models 431 representing relationships between such two types of observation data and state variables will be described using FIG. 14. In FIG. 14, calculation grid points 1 to 8 are arranged in a three-dimensional space. In the present example embodiment, to a state vector, only precipitations $RAIN_k$ are set as state variables at the grid points k (k=1 to 8) illustrated in FIG. 14.

In the present example embodiment, with regard to the GPS precipitable water data $OBS_1$, a value at an observation grid point can be associated with an integrated value of values at two calculation grid points having the same coordinate values in the xy-plane and different z (vertical) coordinate values. In FIG. 14, $OBS_1$ are data collected at observation grid points where values at respective grid points can be associated with the integrated values of values at calculation grid points 1 and 5, 2 and 6, and 4 and 8, each of which have the same xy coordinate values, respectively. Therefore, the observation model 431-1 that represents a relationship between the first observation data $OBS_1$ and the state variables $RAIN_k$ (k=1 to 8) is expressed by the expression (38) below. The expression (38) is a specific example of an observation model expressed by the expression (8).

$$OBS_1 = h_1 \begin{pmatrix} 1 & 0 & 0 & 0 & 1 & 0 & 0 & 0 \\ 0 & 1 & 0 & 0 & 0 & 1 & 0 & 0 \\ 0 & 0 & 0 & 1 & 0 & 0 & 0 & 1 \end{pmatrix} \begin{pmatrix} RAIN_1 \\ RAIN_2 \\ RAIN_3 \\ \vdots \\ RAIN_8 \end{pmatrix} + w_1 \equiv H_1 X + w_1 \quad (38)$$

Next, with regard to the acoustic radar data $OBS_2$, a value at an observation data collection grid point can be associated with the average of values at four calculation grid points that have the same z (vertical) coordinate value, that is, that are included in an identical plane. In FIG. 14, $OBS_2$ are data collected at observation points where values at observation points can be associated with the averages of values at calculation grid points 1 to 4 and 5 to 8, each of which have the same z coordinate value, respectively. Therefore, the observation model 431-2 that represents a relationship between the second observation data $OBS_2$ and the state variables $RAIN_k$ (k=1 to 8) is expressed by the expression (39) below. The expression (39) is a specific example of an observation model expressed by the expression (8).

$$OBS_2 = h_2 \begin{pmatrix} \frac{1}{4} & \frac{1}{4} & \frac{1}{4} & \frac{1}{4} & 0 & 0 & 0 & 0 \\ 0 & 0 & 0 & 0 & \frac{1}{4} & \frac{1}{4} & \frac{1}{4} & \frac{1}{4} \end{pmatrix} \begin{pmatrix} RAIN_1 \\ RAIN_2 \\ RAIN_3 \\ \vdots \\ RAIN_8 \end{pmatrix} + w_2 \equiv H_2 X + w_2 \quad (39)$$

The simulation device 400 configured as described above operates in substantially the same manner as the simulation device 200 as the second example embodiment of the present invention.

In other words, the weather model 241 calculates prior distributions of the state vector at the next time step, which is calculated on the basis of a weather value initial state and terrain parameters (steps S201 and S202 in FIG. 5). The above-described two observation models 431-1 and 431-2 individually transform the prior distributions (steps S203 and S204). A posterior distribution creating unit 40 creates a first posterior distribution or a second posterior distribution at each grid point (steps S205 to S207 and S209). At this time, since no first observation data $OBS_1$ is observed at the grid points 3 and 7, second posterior distributions are created. At the other grid points, first posterior distributions are created.

A posterior distribution unifying unit 250 and a determining unit 51, with respect to the grid points 3 and 7 at which the second posterior distributions is created, create a unified posterior distribution, and determine which one of the created unified posterior distribution and the original second posterior distribution is to be used (steps S300 to S303). The weather model 421, using the state vector generated from posterior distributions, each of which is a first posterior distribution or a determined posterior distribution, with respect to the respective grid points, continues simulation. When a predefined time is reached (Yes in step S304), an output unit 60 outputs a time series of the state vector and finishes the operation.

As described above, the simulation device as the fourth example embodiment of the present invention is applicable to even a case in which observation data cannot be associated with grid points simply in a one-to-one manner and a simulation in a three-dimensional space. Even in such a case, the present example embodiment may, by using appropriate observation models, perform a high-resolution and high-accuracy simulation over a wide range taking into consideration non-ideal observation data and observation data that have a discontinuity or peculiarity.

In each of the above-described example embodiments of the present invention, the description is made mainly on an example in which the respective functional blocks of a simulation device are achieved by a CPU that executes a computer program stored in a storage device or a ROM. Without being limited to the above example, a portion or all of the functional blocks or a combination thereof may be achieved by dedicated hardware.

In each of the above-described example embodiments of the present invention, the functional blocks of a simulation device may be achieved in a distributed manner to a plurality of devices.

In each of the above-described example embodiments of the present invention, an operation of a simulation device that is described with reference to a flowchart may be stored in a storage device (storage medium) as a computer program of the present invention. Such a computer program may be configured to be read and executed by the CPU of the simulation device. In such a case, the present invention is configured as a code of such a computer program or a storage medium storing the computer program.

The above-described example embodiments may be embodied appropriately combined with one another.

The present invention is described using the above example embodiments thereof as typical examples. However, the present invention is not limited to the above example embodiments. That is, various modes that can be understood by a person skilled in the art may be applied to the present invention within the scope of the present invention.

This application claims priority based on Japanese Patent Application No. 2014-172371, filed on Aug. 27, 2014, the entire disclosure of which is incorporated herein by reference.

REFERENCE SIGNS LIST 100, 200, 300, 400 Simulation device
10 Input unit
21 System model
221 Soil model
321 Crop model
421 Weather model
22 Prior distribution storage unit
30 Data selection processing unit
31, 231, 331, 431 Observation model
40 Posterior distribution creating unit
41a First posterior distribution storage unit
41b Second posterior distribution storage unit
50, 250, 350 Posterior distribution unifying unit
51 Determining unit
52 Unified posterior distribution storage unit
60 Output unit
1001 CPU
1002 RAM
1003 ROM
1004 Storage device
1005 Input device
1006 Output device

The invention claimed is:

1. A simulation device, comprising:
a memory that stores a set of instructions; and
at least one processor configured to execute the set of instructions to:
obtain an initial state of a state vector and a parameter in a simulation and a plurality of pieces of observation data as input;
operate as a system model that, based on the initial state and the parameter, simulates a time evolution of the state vector;
select, based on information relating to the state vector in the system model, from the plurality of pieces of observation data, a plurality of pieces of observation data to be used;
operate as plurality of observation models, each being associated with one of the selected plurality of pieces of observation data, each of which transforms and outputs a state vector output from the system model based on a relationship between the observation data and the state vector;
create, based on state vectors output from the plurality of observation models and pieces of observation data selected, posterior distributions of the state vector, outputting a posterior distribution based on all pieces of observation data selected as a first posterior distribution, and output a posterior distribution based on a set of observation data lacking one or more pieces of observation data as a second posterior distribution;
perform unification of the first posterior distribution and the second posterior distribution;
determine which one of the second posterior distribution and a posterior distribution after the unification is to be used; and
output, in addition to inputting a state vector including a posterior distribution determined and the first posterior distribution to the system model, a time series of the state vector,
wherein the state vector represents a subject, and
wherein the observation data is obtained by different sensors measuring the subject.

2. The simulation device according to claim 1, wherein the at least one processor is configured to:
create, by comparing pieces of information that relate to a state vector set in the system model with the pieces of observation data, the observation models related to the pieces of observation data.

3. The simulation device according to claim 1, wherein the at least one processor is configured to:
set noise amounts of the observation models related to the pieces of observation data.

4. The simulation device according to claim 1, wherein the at least one processor is configured to:
use, in processing of unifying the first posterior distribution and the second posterior distribution, a model created based on a correlation between posterior distributions that are already calculated.

5. The simulation device according to claim 4, wherein the at least one processor is configured to:
apply Bayesian updating to a parameter characterizing an arithmetic operation of the model to be used in the unification based on a correlation between posterior distributions that are already calculated.

6. The simulation device according to claim 1, wherein the at least one processor is configured to:
determine, based on variance values of the second posterior distribution and a posterior distribution after the unification, which one of the second posterior distribution and the posterior distribution after the unification is to be used.

7. The simulation device according to claim 1, wherein the state vector includes state variables each of which related to one of grid points discretized in a domain over which simulation is performed, and
the observation models relate the grid points related to the state variables with a degree of resolution of an observation point of one of the plurality of pieces of observation data for each of the pieces of observation data.

8. The simulation device according to claim 1, wherein
a probability distribution of each of the state variables is approximated by a set of ensembles that are discretized and calculated independently of one another, and
the at least one processor is configured to:
perform unification by superposing probability distributions of the state variables at a predetermined ratio, the probability distributions being approximated by the sets of ensembles.

9. The simulation device according to claim 1, wherein
the subject is soil, and
the state vector indicates soil moisture.

10. The simulation device according to claim 1, wherein
the subject is a crop, and
the state vector indicates growth state of the crop.

11. The simulation device according to claim 1, wherein
the subject is weather, and
the state vector indicates precipitation.

12. A simulation method, the method comprising:
when an initial state of a state vector and a parameter in a simulation and a plurality of pieces of observation data are input,
simulating a time evolution of the state vector using a system model based on the initial state and the parameter;
selecting, from the plurality of pieces of observation data, a plurality of pieces of observation data to be used based on information related to the state vector in the system model;
transforming, by use of a plurality of observation models each of which is associated with one of the selected plurality of pieces of observation data, the state vector output from the system model based on a relationship between the piece of observation data and the state vector;
creating posterior distributions of the state vector based on state vectors output from the plurality of observation models and the selected pieces of observation data;
performing unification of a first posterior distribution based on all the selected pieces of observation data and a second posterior distribution based on a set of observation data lacking one or more pieces of observation data;
determining which one of the second posterior distribution and a posterior distribution after the unification is to be used;
inputting a state vector including a determined posterior distribution and the first posterior distribution to the system model; and
outputting a time series of a state vector including a determined posterior distribution and the first posterior distribution
wherein the state vector represents a subject, and
wherein the observation data is obtained by different sensors measuring the subject.

13. A non-transitory computer-readable storage medium storing a computer program, the program making a computer device execute:
input processing of obtaining an initial state of a state vector and a parameter in a simulation and a plurality of pieces of observation data as input;
system model calculation processing of, based on the initial state and the parameter, simulating a time evolution of the state vector using a system model;
data selection processing of, based on information relating to the state vector in the system model, selecting, from the plurality of pieces of observation data, a plurality of pieces of observation data to be used;
observation model calculation processing of, by use of a plurality of observation models each of which is associated with one of the selected plurality of pieces of observation data, transforming and outputting each state vector output from the system model based on a relationship between the piece of observation data and the state vector;
posterior distribution creating processing of, based on state vectors output from the plurality of observation models and pieces of observation data selected in the data selection processing, creating posterior distributions of the state vector, outputting a posterior distribution based on all pieces of observation data selected in the data selection processing as a first posterior distribution, and outputting a posterior distribution based on a set of observation data lacking one or more pieces of observation data as a second posterior distribution;
posterior distribution unifying processing of performing unification of the first posterior distribution and the second posterior distribution;
determining processing of determining which one of the second posterior distribution and a posterior distribution after the unification is to be used; and
output processing of inputting a state vector including a posterior distribution determined in the determining processing and the first posterior distribution to the system model and outputting a time series of the state vector,
wherein the state vector represents a subject, and
wherein the observation data is obtained by different sensors measuring the subject.

* * * * *

UNITED STATES PATENT AND TRADEMARK OFFICE
CERTIFICATE OF CORRECTION

PATENT NO. : 10,474,770 B2
APPLICATION NO. : 15/506505
DATED : November 12, 2019
INVENTOR(S) : Mineto Satoh and Soichiro Araki Page 1 of 1

It is certified that error appears in the above-identified patent and that said Letters Patent is hereby corrected as shown below:

In the Specification

Column 11, Description of Embodiments, Line 21; Delete "$h_m$," and insert --$h_m$-- therefor Column 11, Description of Embodiments, Line 29; Delete "$w_m$," and insert --$w_m$-- therefor Column 15, Description of Embodiments, Line 33; Delete "Y2," and insert --$y_2$,-- therefor Column 26, Description of Embodiments, Lines 66-67; Delete "$\xi=(\tau_2,\sigma^2,\phi)$" and insert --$\xi=(\tau^2,\sigma^2,\phi)$-- therefor Signed and Sealed this
Twenty-fourth Day of November, 2020

Andrei Iancu
*Director of the United States Patent and Trademark Office*